(12) United States Patent
Huang et al.

(10) Patent No.: US 12,393,239 B2
(45) Date of Patent: Aug. 19, 2025

(54) METHOD AND APPARATUS FOR AN EMBEDDED CONTROLLER (EC) USED TO IDENTIFY DIFFERENT INSTALLED COOLING FAN TYPES AND OPERATING PERFORMANCE CONFIGURATIONS

(71) Applicant: Dell Products, LP, Round Rock, TX (US)

(72) Inventors: Shao-Ku Huang, Da'an District (TW); Adolfo S. Montero, Pflugerville, TX (US); Tse-An Chu, Zhongshan District (TW); Hao-Wu Yang, Zhongzheng District (TW)

(73) Assignee: DELL PRODUCTS LP, Round Rock, TX (US)

( * ) Notice: Subject to any disclaimer, the term of this patent is extended or adjusted under 35 U.S.C. 154(b) by 245 days.

(21) Appl. No.: 18/214,864

(22) Filed: Jun. 27, 2023

(65) Prior Publication Data

US 2025/0004511 A1 Jan. 2, 2025

(51) Int. Cl.
*G06F 1/20* (2006.01)
*H05K 7/20* (2006.01)

(52) U.S. Cl.
CPC .......... *G06F 1/20* (2013.01); *H05K 7/20209* (2013.01)

(58) Field of Classification Search
CPC .............................. G06F 1/20; H05K 7/20209
See application file for complete search history.

(56) References Cited

U.S. PATENT DOCUMENTS

| | | |
|---|---|---|
| 5,974,474 A | 10/1999 | Furner |
| 6,028,996 A | 2/2000 | Sniderman |
| 6,572,384 B1 | 6/2003 | Marchevsky |
| 10,866,006 B2 | 12/2020 | Lambert |
| 11,706,847 B2 | 7/2023 | Ohrmann |
| 2002/0103546 A1 | 8/2002 | O'Connor |
| 2013/0336760 A1 | 12/2013 | Li |
| 2014/0192475 A1* | 7/2014 | Tunks ............... G06F 1/206 165/244 |
| 2016/0292959 A1* | 10/2016 | Salzman ........... G07F 17/3216 |
| 2019/0390864 A1 | 12/2019 | Lambert |
| 2020/0088793 A1 | 3/2020 | Montero |
| 2021/0408942 A1* | 12/2021 | Campbell ........... H02P 29/028 |
| 2022/0207125 A1 | 6/2022 | Young |
| 2022/0207185 A1 | 6/2022 | Young |
| 2022/0400573 A1* | 12/2022 | Komaranalli ...... H05K 7/20972 |
| 2023/0127882 A1 | 4/2023 | Young |

* cited by examiner

*Primary Examiner* — Zachary K Huson
(74) *Attorney, Agent, or Firm* — Prol Intellectual Property Law, PLLC; H. Kenneth Prol

(57) ABSTRACT

An information handling system includes a hardware processor and an embedded controller (EC), an installed cooling fan with an identification hardware gasket of a plurality of hardware gaskets where the embedded controller executes computer readable program code of a hardware fan configuration detection system to detect a type of the installed cooling fan within the information handling system via a hardware fan detection circuit. The hardware fan detection circuit includes a resistor network operatively coupled to the EC and a plurality of PCB contact pads operatively coupled along the resistor network, where placement of the identification hardware gasket of the installed cooling fan on a first PCB contact pad of the plurality of PCB contact pads identifies the installed cooling fan by generating a fan contact signal for selection of a fan operation table to operate the installed cooling fan.

20 Claims, 13 Drawing Sheets

METHOD AND APPARATUS FOR AN EMBEDDED CONTROLLER (EC) USED TO IDENTIFY DIFFERENT INSTALLED COOLING FAN TYPES AND OPERATING PERFORMANCE CONFIGURATIONS

FIELD OF THE DISCLOSURE

The present disclosure generally relates to installed cooling fan detection within an information handling system. The present disclosure more specifically relates to cooling fan vendor detection or model type printed circuit board contact within an information handling system using an analog-to-digital (A/D) input pin at an embedded controller (EC).

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling needs and requirements vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. Still further, information handling systems may include hardware that can be manufactured by one of a plurality of manufacturers with each vendor-manufactured hardware device having slightly different operating characteristics from other vendor-manufactured hardware devices.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
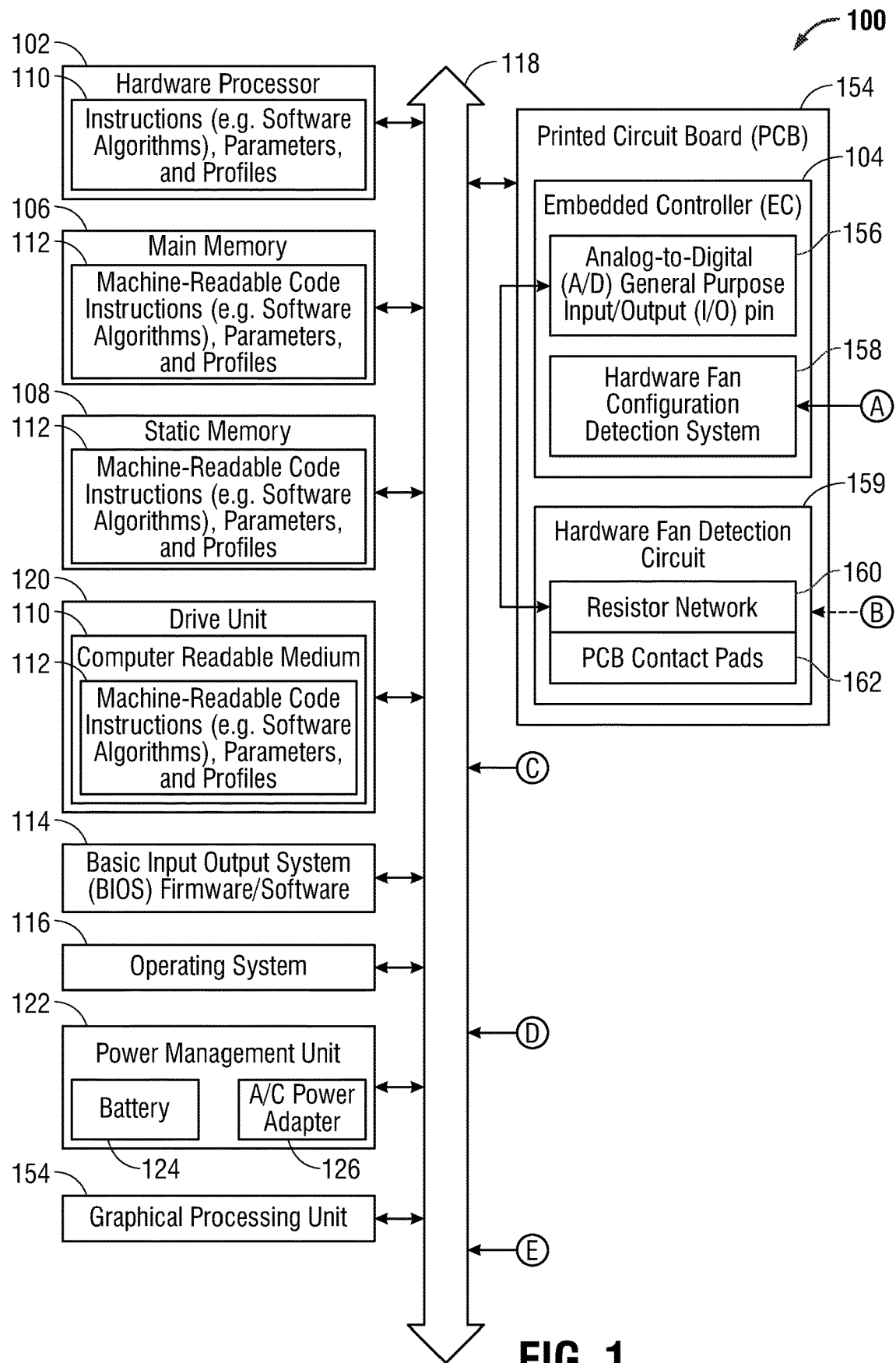
FIG. 1 is a block diagram of an information handling system including a hardware fan configuration detection system used to detect and identify the cooling fan installed within the information handling system according to an embodiment of the present disclosure.
Figure 1:
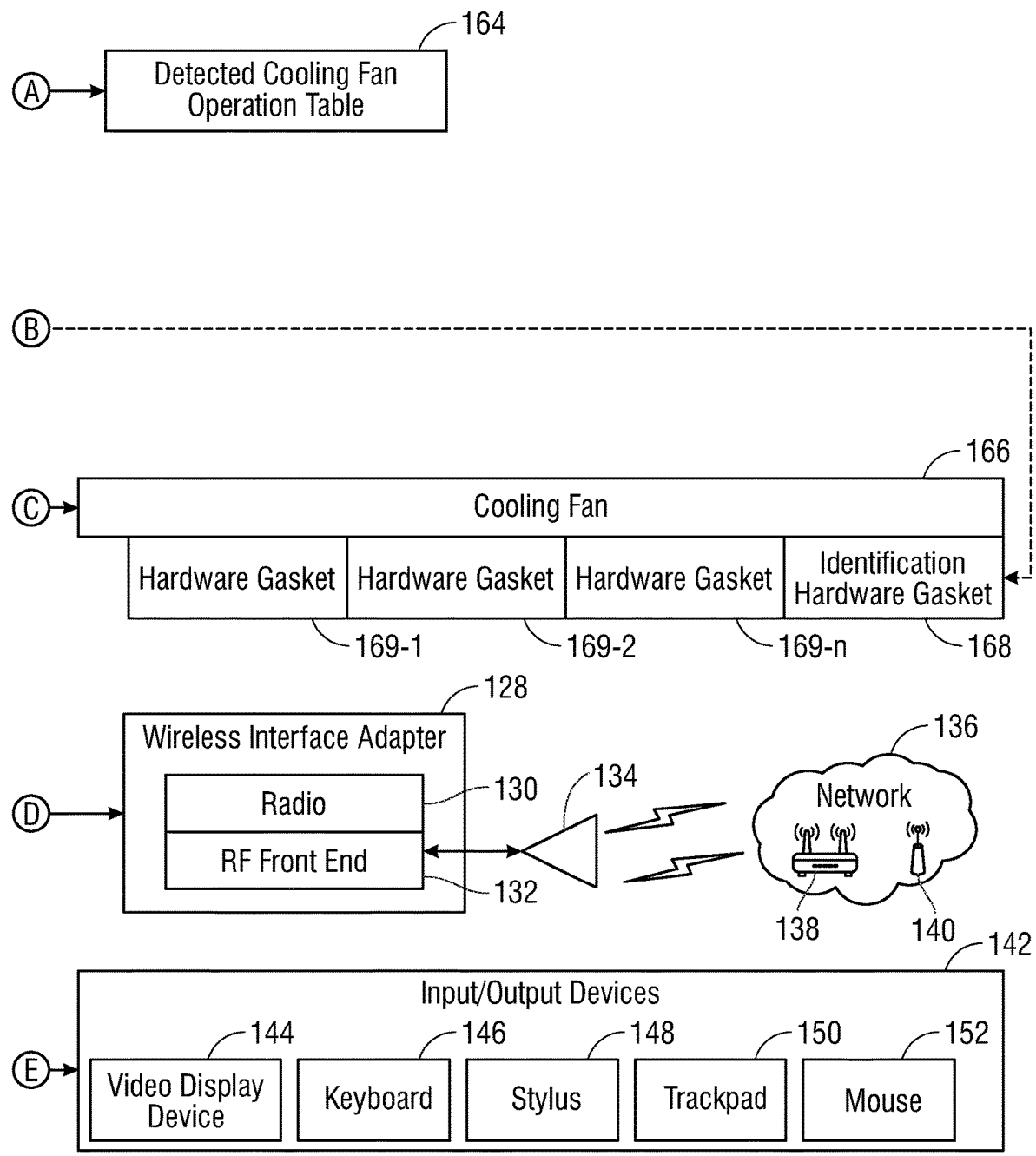

The following description in combination with the Figures is provided to assist in understanding the teachings disclosed herein. The description is focused on specific implementations and embodiments of the teachings and is provided to assist in describing the teachings. This focus should not be interpreted as a limitation on the scope or applicability of the teachings.

Information handling systems operate to provide computing, data storage, and application resources among other computing resources. During operation of the information handling system, power consumption and operation of various hardware devices creates heat within the housing of the information handling system. Left unaddressed, this heat may cause damage to the components of the information handling system such as those hardware processors formed therein or may impact performance of those hardware components. A cooling fan may be used to remove heat from these heat generating hardware components and pass that heated air out of a housing of the information handling system. During manufacturing of the information handling system, however, various different cooling fans may be placed within the housing of the information handling system. Additionally, these various different cooling fans may not only have different manufacturers but also have differing operating characteristics. These different operating characteristics may include a difference in fan speed (e.g., rounds per minute), air displacement (e.g., cubic feet per minute air displacement), acoustic performance, and fan blade length, among other characteristics. For example, air displacement at a certain RPM of a particular vendor-manufactured cooling fan may vary significantly from the air displacement at the same RPM of a different vendor-manufactured cooling fan. Even where a manufacturer of an information handling system requests specific cooling fan specifications, the cooling capabilities of the cooling fans manufactured by the different cooling fan vendors may differ slightly. These differences can be determined by conducting laboratory experiments, but the manufacturer of the information handling system may find it difficult to coordinate augmenting the manufactured information handling system for each and every vendor-provided cooling fan. This leaves the manufacturer of the information handling system with the only option to determine the worst performing fan provided amongst the cooling fan vendors as a lowest common denominator set of cooling performance metrics. This also leads to the manufacturer of the information handling system having to make tradeoffs in order to account for these variations in cooling characteristics among the different cooling fan manufacturers.

The present specification describes an information handling system that includes a hardware processor, a memory device, and a power management unit (PMU) to provide power to the hardware processor and memory device. The hardware processor may execute computer readable program code of a hardware fan configuration detection system to detect, along with a hardware fan detection circuit, a type of installed cooling fan within the information handling system. The hardware fan configuration detection system may interface with this hardware fan detection circuit that includes a resistor network operatively coupled to the hardware processor with a plurality of PCB contact pads operatively coupled along the resistor network. The manufacturer of the information handling system may request from each cooling fan vendor that their produced cooling fans include at least one identification hardware gasket among a plurality of hardware gaskets that are to operatively interface with the one or more PCB contact pads. The number and arrangement of the hardware gaskets and the identification hardware gaskets produced by each cooling fan vendor on a cooling fan type differs such that interaction between the identification hardware gaskets among the hardware gaskets with the PCB contact pads indicates, at least, the vendor who manufactured the cooling fan.

The interaction between the at least one identification hardware gasket and the PCB contact pads on the resistor network allows the EC to determine via a contact signal which, if any of the PCB contact pads are interacting with the hardware gaskets. For example, this interaction creates different levels of voltage detected at the EC that may serve as the fan contact signal. In an embodiment, the hardware processor is an embedded controller and the resistor network is operatively coupled to an analog-to-digital general-purpose input/output (AD GPIO) pin of the embedded controller to receive the fan contact signal.

In an embodiment, the PCB contact pads includes a grounded PCB contact pad, a source voltage PCB contact pad, and a bit identification PCB contact pad. By operatively coupling the source voltage PCB contact pad with the bit identification PCB contact pad using the hardware gasket, a voltage at the particular resistor network node along the resistor network is provided. Similarly, by operatively coupling the grounded PCB contact pad with the bit identification PCB contact pad using the hardware gasket, the particular resistor network node is grounded. In an embodiment, therefore, a total voltage may be detected from each resistor network node at an analog-to-digital general-purpose input/output (A/D GPIO) pin of the hardware processor as the fan contact signal that is used to identify the installed cooling fan. In some embodiments, the coupling of the hardware gasket to any of the PCB contact pads alone may determine whether a voltage or additional voltage is measured at the A/D GPIO pin.

In an embodiment, a detected cooling fan operation table stored on the memory device is selected by the hardware fan configuration detection system based on a voltage of the fan contact signal detected at the resistor network to identify operating characteristics of the installed cooling fan that has been detected by the cooling fan detection circuit. The EC executing code instructions of the hardware fan configuration detection system may cross-reference a table that, based on the detected voltage at the A/D GPIO pin of the EC, references the specific type and manufacturing vendor of the installed cooling fan. Then the EC executing code instructions of the hardware fan configuration detection system selects the detected cooling fan operation table for use with the cooling system or fan drivers by the information handling system optimized for operation of the detected type of hardware cooling fan. This selected cooling fan operation table for the detected cooling fan includes data related to the now-identified cooling fan which is used by a hardware processor operating the cooling fan to adjust the operation of that cooling fan according to variances of operation such as rated for speeds, air displacement, acoustic performance, or other characteristics. Adjustments to the operation of the now-identified cooling fan may include adjustments to the RPM ranges and frequency of initiation of the cooling fan that are tailored to that installed cooling fan in the information handling system in an embodiment.

FIG. 1 illustrates an information handling system 100 similar to information handling systems according to several aspects of the present disclosure. In the embodiments described herein, an information handling system 100 includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 can be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a convertible laptop, a tablet, a smartphone, a communications device, an access point (AP), a base station transceiver, a wireless telephone, a control system, a camera, a scanner, a printer, a personal trusted device, a web appliance, or any other suitable machine capable of executing a set of instructions (sequential or otherwise) that specify actions to be taken by that machine, and can vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the computer system 100 can be implemented using electronic devices that provide voice, video, or data communication. For example, an information handling system 100 may be any mobile or other computing device capable of executing a set of instructions (sequential or otherwise) that specify actions to be taken by that machine. In an embodiment, the information handling system 100 may be operatively coupled to a server or other network device as well as operatively coupled to or "paired" with any wireless peripheral devices. Further, while a single information handling system 100 is illustrated, the term "system" shall also be taken to include any collection of systems or sub-systems that individually or jointly execute a set, or multiple sets, of instructions to perform one or more computer functions.

The information handling system 100 may include memory (volatile (e.g., random-access memory, etc.), non-volatile (read-only memory, flash memory etc.) or any combination thereof), one or more hardware processing resources, such as a central processing unit (CPU), a graphics processing unit (GPU) 152, an embedded controller (EC) 104, a hardware processor 102, hardware controllers, or any combination thereof. Additional components of the information handling system 100 can include one or more storage devices, one or more communications ports for communicating with external devices, as well as various input and output (I/O) devices 140, such as a keyboard 144, a mouse 150, a video display device 142, a stylus 146, a trackpad 148, or any combination thereof. In an embodiment, these I/O devices 140 may be wired or wireless. The information handling system 100 can also include one or more buses 118 operable to transmit data communications between the various hardware components described herein. Portions of an information handling system 100 may themselves be considered information handling systems and some or all of which may be wireless.

Information handling system 100 can include devices or modules that embody one or more of the devices or execute instructions for the one or more systems and modules described above, and operates to perform one or more of the methods described herein. The information handling system 100 may execute machine-readable code instructions 110 via the described hardware processing resources that may operate on servers or systems, remote data centers, or on-box in individual client information handling systems according to various embodiments herein. In some embodiments, it is understood any or all portions of machine-readable code instructions 110 may operate on a plurality of information handling systems 100.

As described herein, the information handling system 100 may include hardware processing resources such as a hardware processor 102, a central processing unit (CPU), accelerated processing unit (APU), an embedded controller (EC) 104, a neural processing unit (NPU), a vision processing unit (VPU), a digital signal processor (DSP), a GPU 152, a microcontroller, or any other type of hardware processing device that executes code instructions to perform the processes described herein. Any of the hardware processing resources may operate to execute code that is either firmware or software code. Moreover, the information handling system 100 can include memory devices such as main memory 104, static memory 106, computer readable medium 108 storing instructions 110 of, in an example embodiment, a hardware fan configuration detection system 158, or other computer executable program code, and drive unit 120 (volatile (e.g., random-access memory, etc.), non-volatile (read-only memory, flash memory etc.) or any combination thereof). These memory devices may be accessed by any of the hardware processors described herein to access computer-readable program code of the hardware fan configuration detection system 158 as well as data associated with the detected cooling fan operation table 164 as described herein.

As shown, the information handling system 100 may further include a video display device 142. The video display device 142, in an embodiment, may function as a liquid crystal display (LCD), an organic light emitting diode (OLED), a flat panel display, or a solid-state display. Although FIG. 1 shows a single video display device 142, the present specification contemplates that multiple video display devices 142 may be used with the information handling system to facilitate an extended desktop scenario, for example. Additionally, the information handling system 100 may include one or more input/output devices 140 including an alpha numeric input device such as a keyboard 144 and/or a cursor control device, such as a mouse 150, touchpad/trackpad 148, a stylus 146, or a gesture or touch screen input device associated with the video display device 142 that allow a user to interact with the images, windows, and applications presented to the user.

A network interface device of the information handling system 100 shown as wireless interface adapter 128 can provide connectivity among devices such as with Bluetooth® or to a network 134, e.g., a wide area network (WAN), a local area network (LAN), wireless local area network (WLAN), a wireless personal area network (WPAN), a wireless wide area network (WWAN), or other network. In an embodiment, the WAN, WWAN, LAN, and WLAN may each include an access point 136 or base station 138 used to operatively couple the information handling system 100 to a network 134. In a specific embodiment, the network 134 may include macro-cellular connections via one or more base stations 138 or a wireless access point 136 (e.g., Wi-Fi or WiGig), or such as through licensed or unlicensed WWAN small cell base stations 138. Connectivity may be via wired or wireless connection. For example, wireless network access points 136 or base stations 138 may be operatively connected to the information handling system 100. Wireless interface adapter 128 may include one or more radio frequency (RF) subsystems (e.g., radio 128) with transmitter/receiver circuitry, modem circuitry, one or more antenna front end circuits 132, one or more wireless controller circuits, amplifiers, antennas 134-1, 134-2 and other circuitry of the radio 130-1, 130-2 such as one or more antenna ports used for wireless communications via multiple radio access technologies (RATs). The radio 130-1, 130-2 may communicate with one or more wireless technology protocols. In and embodiment, the radio 130-1, 130-2 may contain individual subscriber identity module (SIM) profiles for each technology service provider and their available protocols for any operating subscriber-based radio access technologies such as cellular LTE communications.

In some aspects of the present disclosure, the wireless interface adapter 128 may operate two or more wireless links. In an embodiment, the wireless interface adapter 128 may operate a Bluetooth® wireless link using a Bluetooth® wireless or Bluetooth® Low Energy (BLE). As described herein, the BLE wireless link may be used to communicate with and operatively couple a wireless peripheral device 156 to the information handling system 100. In an embodiment, the Bluetooth® wireless protocol may operate at frequencies between 2.402 to 2.48 GHz. Other Bluetooth® operating frequencies such as Bluetooth® operating frequencies such as 6 GHz are also contemplated in the presented description. In an embodiment, a Bluetooth® wireless link may be used to wirelessly couple the input/output devices operatively and wirelessly including the mouse 150, keyboard 144, stylus 146, trackpad 148, and/or video display device 142 to the bus 118 in order for these devices to operate wirelessly with the information handling system 100.

In an embodiment, the wireless interface adapter 128 may operate in accordance with any wireless data communication standards. To communicate with a wireless local area network, standards including IEEE 802.11 WLAN standards (e.g., IEEE 802.11ax-2021 (Wi-Fi 6E, 6 GHZ)), IEEE 802.15 WPAN standards, WWAN such as 3GPP or 3GPP2, Bluetooth® standards, or similar wireless standards may be used. Wireless interface adapter 128 may connect to any combination of macro-cellular wireless connections including 2G, 2.5G, 3G, 4G, 5G or the like from one or more service providers. Utilization of radio frequency communication bands according to several example embodiments of the present disclosure may include bands used with the WLAN standards and WWAN carriers which may operate in both licensed and unlicensed spectrums.

The wireless interface adapter 128 can represent an add-in card, wireless network interface module that is integrated with a main board of the information handling system 100 or integrated with another wireless network interface capability, or any combination thereof. In an embodiment the wireless interface adapter 128 may include one or more radio frequency subsystems including transmitters and wireless controllers for connecting via a multitude of wireless links. In an example embodiment, an information handling system 100 may have an antenna system transmitter for Bluetooth®, BLE, 5G small cell WWAN, or Wi-Fi WLAN connectivity and one or more additional antenna system transmitters for macro-cellular communication. The RF subsystems and radios 130-1, 130-2 and include wireless controllers to manage authentication, connectivity, communications, power levels for transmission, buffering, error correction, baseband processing, and other functions of the wireless interface adapter 128.

The information handling system 100 also includes a printed circuit board (PCB) 154 onto which a hardware fan detection circuit 159 for use with a hardware fan configuration detection system 158 may be formed. The hardware fan configuration detection circuit 159 may include hardware that detects that a cooling fan 166 is installed into the information handling system 100 and identify that cooling fan 166 via the hardware fan configuration detection system 158. As described herein this allows for a manufacturer of the information handling system to, for example, detect which vendors' cooling fan has been installed into the information handling system 100 in order to adjust operation of the installed cooling fan with selection of a detected cooling fan operation table 164 accordingly.

In an embodiment, the PCB 154 may house hardware components for use with the hardware fan configuration detection system 158 including an EC 104 and the hardware fan detection circuit 159 with a resistor network 160, and one or more PCB contact pads 162. In an embodiment, the PCB contact pads 162 may be arranged next to the cooling fan 166 such that one or more hardware gaskets 169-1, 169-2, 169-$n$ formed on the cooling fan 166 as an identification hardware gasket may interact with at least one of the PCB contact pads 162 as described herein. In an embodiment, the hardware gaskets 169-1, 169-2, 169-$n$ may be an extension of an electromagnetic interference (EMI) shield of the cooling fan 166. As described, the hardware gaskets 169-1, 169-2, 169-$n$ may include at least one identification hardware gasket 168 among the hardware gaskets 169-1, 169-2, 169-$n$ in some embodiments. The at least one identification hardware gasket 168 among the hardware gaskets 169-1, 169-2, 169-$n$ may be a type of hardware gasket that includes an electrical interface or electrical conductor that interacts electrically with the PCB contact pads 162 or sub-pad portions resulting in a level of voltage being detected at a resistor node of the resistor network 160 within the hardware fan detection circuit 159.

In an embodiment, the resistor network 160 of the hardware fan detection circuit 159 formed on the PCB 154 may be intermediate between the PCB contact pads 162 and the EC 104. The resistor network 160 may be operatively coupled to an analog-to-digital (A/D) general-purpose input output (GPIO) pin of the EC 104 so that an analog voltage signal at the resistor network 160 may be converted into a digital signal at the EC 104 forming a hardware contact signal for use in determining the type of cooling fan 166 installed in the information handling system 100. The resistor network 160 may include any electrical circuit that may include one or more resistors formed along the resistor network 160 of the hardware fan detection circuit 159. During operation, the contact and/or orientation of that contact between at least one identification hardware gasket 168 formed on the cooling fan 166 and the PCB contact pads 162 formed along the resistor network 160 creates this hardware contact signal detectable at the A/D GPIO pin 156 of the EC 104.

In an example embodiment, the resistor network 160 of the hardware fan detection circuit 159 may include an R-2R resistor ladder network. The R-2R resistor ladder network may include a grounded end with one or more resistor network nodes formed along the resistor network 160 with each of the resistor network nodes terminating at one or more PCB contact pads 162 of the hardware fan detection circuit 159. In various embodiments, the number of resistor network nodes is two or three. In an embodiment, the portion of the resistor network 160 of the hardware fan detection circuit 159 between the terminal end (e.g., at the PCB contact pads 162) and a first resistor network node in the R-2R resistor ladder network may have a resistor having a resistive value equal to two times those resistors placed between the first resistor network node and a second or subsequent resistor network node. Additionally, each resistor network node may include a 2R resistor operatively coupling the node and each PCB contact pad that has a resistive value equal to two times those resistors (R) placed between the first resistor network node and a second or subsequent resistor network node in an embodiment to form an R-2R ladder. The resistor network node has a number of PCB contact pads 162 with one or more sub-pad configurations operatively coupled to each resistor network. In an embodiment, the number of PCB contact pads 162 formed is three. In other embodiments, the PCB contact pads 162 may each have two or three contact sub-pad portions for an identification hardware gasket 168 of an installed fan to electrically bridge two of the PCB contact pad portions. In an embodiment, an identification hardware gasket 168 may have a conductor to make electrical connection between sub-pads or ground a PCB contact pad for a node. For example, in an embodiment, the PCB contact pads 162 may include a grounded PCB contact sub-pad, a source voltage PCB contact sub-pad, and a bit identification PCB contact sub-pad. In an embodiment, each of the grounded PCB contact sub-pad, source voltage PCB contact sub-pad, and bit identification PCB contact sub-pad, are electrically isolated from each other. During operation, when a identification hardware gasket 168 interacts with two of the grounded PCB contact sub-pad, source voltage PCB contact sub-pad, and bit identification PCB contact sub-pad, a voltage may be detected or not detected at that resistor network node operatively coupled to the resistor network 160. For example, where the identification hardware gasket 168 interacts between the grounded PCB contact sub-pad and the bit identification PCB contact sub-pad (e.g., electrically coupling the two sub-pads), a lower divided voltage is realized at that resistor network node. Additionally, where the identification hardware gasket 168 interacts between the source voltage PCB contact sub-pad and the bit identification PCB contact sub-pad, a higher divided voltage is realized at that resistor network node. The total voltage detected at the A/D GPIO pin 156 of the EC 104 is used to determine which type of cooling fan 166 has been installed. It is appreciated that the number of identification hardware gaskets 169 may be more than one and that each of the PCB contact pads 162 may interface with an identification hardware gasket 168 to either create a lower divided voltage or higher divided voltage at a particular resistor network node such that a total voltage signal detected at the A/D GPIO pin 156 of the EC 104 is used to determine which type of cooling fan 166 has been installed within the information handling system 100. Further, for purposes of the present disclosure, the term "type" when referencing a cooling fan 166 may include different cooling fans models manufactured by different vendors of those cooling fans 166 that may be potentially installed into the information handling system 100.

In another example embodiment, the resistor network 160 of the hardware fan detection circuit 159 may include one or more PCB contact pads 162 placed, intermittently, between resistors having varying resistance values to form a linear resistor network. In this embodiment, an end of the resistor network 160 may be operatively coupled to ground on one node with a source voltage operatively coupled to the other node of the voltage divider. In an embodiment, each of the PCB contact pads 162 may be couplable to ground using an electrical connection via an identification hardware gasket 168 of an installed cooling fan 166. In this embodiment, the identification hardware gasket 168, where present to interact electrically with one or more of the PCB contact pads 162, may include a conductive pad that grounds the PCB contact pads 162 when contacted. A voltage source node on the end of the linear resistor network 160 may be provided and the resistor network 160 may be operatively coupled to the A/D GPIO pin 156 of the EC 104 as described herein. Again, where a voltage level is detected at the A/D GPIO pin 156 of the EC 104, this voltage value may be used to determine which cooling fan 166 is installed in the information handling system 100. In an embodiment, the voltage detected at the A/D GPIO pin 156 of the EC 104 serves as the fan contact signal with the level of voltage being based on which PCB contact pad 162 is grounded within the voltage divider via a conductive surface on the identification hardware gaskets 168 of the installed cooling fan 166. It is appreciated that in this linear resistor network embodiment, the grounding at a first PCB contact pad 162 closest to the voltage source and EC 104 will have a divided voltage higher than a grounding of a subsequent PCB contact pad 162 further distal to the first PCB contact pad 162 along the linear resistor network.

In yet another example embodiment, the resistor network 160 of the hardware fan detection circuit 159 may include an R-2R resistor ladder network modified with one or more metal-oxide-semiconductor field-effect transistors (MOSFETs) formed at each resistor network node. The R-2R resistor ladder network may include a grounded end with one or more resistor network nodes formed along the resistor network 160 and terminating at one or more PCB contact pads 162. In an embodiment, the number of resistor network nodes is three. In one embodiment, the portion of the resistor network 160 between the grounded end and a first resistor network node in the R-2R resistor ladder network may have a resistor having a resistive value equal to two times those resistors placed between the first resistor network node and a second or subsequent resistor network node via a series of nodes. Additionally, each resistor network node may include a resistor having a resistive value equal to two times those resistors placed between the first resistor network node and a second or subsequent resistor network node. At each of each of the resistor network nodes, a number of PCB contact pads 162 are formed each of which may include two sub-pads (e.g., each PCB contact pad 162 divided into two) for at least one identification hardware gasket 168 among the plurality of hardware gaskets 169-1, 169-2, 169-n to bridge a gate voltage at a MOSFET to ground. In this embodiment, the PCB contact pads 162 may include a first PCB contact sub-pad operatively coupled to a gate of the MOSFET and a second PCB contact sub-pad operatively coupled to a source of the MOSFET. During operation, when a identification hardware gasket 168 interacts with the two PCB contact sub-pads of the PCB contact pads 162 by coupling them together thereby shorting (e.g., via a conductive surface on the identification hardware gasket 169) the MOSFET gate to the source and to ground, the MOSFET is turned off thereby providing a logic low voltage on that particular resistor network node. Where no identification hardware gasket 168 shorts a particular set of PCB contact sub-pads of the PCB contact pads 162, a voltage source (Voc) will turn on the MOSFET and provide a logic high voltage on that particular resistor network node. The total voltage detected at the A/D GPIO pin 156 from the combination of node values at the EC 104 is used to determine which type of cooling fan 166 has been installed.

The voltage from the resistor network 160 of the hardware fan detection circuit 159 detected at the A/D GPIO pin 156 of the EC 104 is used to determine which type of cooling fan 166 has been installed in the information handling system 100. The computer readable program code of the hardware fan configuration detection system 158 may, when executed by a hardware processing device (e.g., CPU, GPU, EC, microcontroller, and the like), cross-references that detected voltage with a type of cooling fan identified to select a correct detected cooling fan operation table 164. The hardware fan configuration detection system 158 may access a listing of various types of cooling fans 166 as well as a corresponding detected voltage of a received fan contact signal from the hardware fan detection circuit 159. Where a detected voltage of the fan contact signal is associated with a listed type of cooling fan 166, the hardware fan configuration detection system 158 determines that that cooling fan 166 is currently installed in the information handling system 100. The hardware fan configuration detection system 158 may then cause the cooling fan 166 to be operated according to the particular operating parameters associated with the detected cooling fan 166 with the detected cooling fan operation table 164 selected and used with a fan or cooling system driver. For example, based on the operating parameters of the detected cooling fan 166 on the detected cooling fan operation table 164, the hardware fan configuration detection system 158, via a hardware processor, operates the cooling fan 166 to increase the RPMs of the cooling fan 166, decrease the RPMs of the cooling fan 166, increase the frequency of initiating the cooling fan 166, or decreasing the frequency of initiating the cooling fan 166, among other operating parameters associated with the operation of the cooling fan 166 in order to optimize the cooling of the hardware within the information handling system 100.

In an embodiment, the information handling system 100 can include one or more sets of machine-readable code instructions, parameters, and profiles 112 that can be executed to cause the computer system to perform any one or more of the methods or computer-based functions disclosed herein. For example, machine-readable code instructions, parameters, and profiles 112 may execute, via hardware processing resources, various software applications, software agents, the BIOS 114 firmware and/or software, hardware drivers such as fan driver or cooling system drivers (e.g., thermal control drivers), or other aspects or components. Machine-readable code instructions, parameters, and profiles 112 may execute, via the information handling system 100, the hardware fan configuration detection system 158 that is used with the hardware fan detection circuit 159 for detection and verification of the installed cooling fan 166 in the information handling system 100 according to embodiments herein. Again, the machine-readable code instructions, parameters, and profiles 112 described herein may be stored on a non-volatile memory device and made accessible to the EC 104, the hardware processor 104, a microcontroller unit (MCU), or other hardware processing resource for execution. Various software modules comprising application instructions of machine-readable code instructions, parameters, and profiles 112 may be coordinated by an operating system (OS) 116, and/or via an application programming interface (API). An example OS 116 may include Windows®, Android®, and other OS types known in the art. Example APIs may include Win 32, Core Java API, or Android APIs.

In an embodiment, the disk drive unit 120 and may include machine-readable code instructions, parameters, and profiles 112 in which one or more sets of machine-readable code instructions, parameters, and profiles 112 such as software can be embedded to be executed by the processor 102 or other hardware processing devices such as a GPU 154 to perform the processes described herein. Similarly, main memory 106 and static memory 108 may also contain a computer-readable medium for storage of one or more sets of machine-readable code instructions, parameters, or profiles 112 described herein. The disk drive unit 120 or static memory 108 also contain space for data storage. Further, the machine-readable code instructions, parameters, and profiles 112 may embody one or more of the methods as described herein. In a particular embodiment, the machine-readable code instructions, parameters, and profiles 112 may reside completely, or at least partially, within the main memory 106, the static memory 108, and/or within the disk drive 120 during execution by the hardware processor 102, EC 104, or GPU 154 of information handling system 100. The main memory 106, GPU 154, EC 104, and the hardware processor 102 also may include computer-readable media.

Main memory 106 or other memory of the embodiments described herein may contain computer-readable medium (not shown), such as RAM in an example embodiment. An example of main memory 106 includes random access memory (RAM) such as static RAM (SRAM), dynamic RAM (DRAM), non-volatile RAM (NV-RAM), or the like, read only memory (ROM), another type of memory, or a combination thereof. Static memory 108 may contain computer-readable medium (not shown), such as NOR or NAND flash memory in some example embodiments. The applications and associated APIs, for example, may be stored in static memory 108 or on the disk drive unit 120 that may include access to a machine-readable code instructions, parameters, and profiles 112 such as a magnetic disk or flash memory in an example embodiment. While the computer-readable medium is shown to be a single medium, the term "computer-readable medium" includes a single medium or multiple media, such as a centralized or distributed database, and/or associated caches and servers that store one or more sets of machine-readable code instructions. The term "computer-readable medium" shall also include any medium that is capable of storing, encoding, or carrying a set of machine-readable code instructions for execution by a processor or that cause a computer system to perform any one or more of the methods or operations disclosed herein.

In an embodiment, the information handling system 100 may further include a power management unit (PMU) 122 (a.k.a. a power supply unit (PSU)). The PMU 122 may include a hardware controller and executable machine-readable code instructions to manage the power provided to the components of the information handling system 100 such as the hardware processor 102, and other hardware components described herein. The PMU 122 may control power to one or more components including the one or more drive units 120, the hardware processor 102 (e.g., CPU), the EC 104, the cooling fan 166, the GPU 154, a video/graphic display device 144, or other wired input/output devices 140 such as the stylus 148, a mouse 152, a keyboard 146, and a trackpad 150 and other components that may require power when a power button has been actuated by a user. In an embodiment, the PMU 122 may monitor power levels and be electrically coupled, either wired or wirelessly, to the information handling system 100 to provide this power and coupled to bus 118 to provide or receive data or machine-readable code instructions. The PMU 122 may regulate power from a power source such as a battery 124 or AC power adapter 126. In an embodiment, the battery 124 may be charged via the AC power adapter 126 and provide power to the components of the information handling system 100, via wired connections as applicable, or when AC power from the AC power adapter 126 is removed. PMU 122 may include a hardware controller to operate with the EC 104 separately or together to execute machine-readable code instructions, parameters, and profiles 112 of the hardware fan configuration detection system 158 at the information handling system 100. The PMU 122 may also operate with a fan driver or thermal control driver executing on a hardware processing resource to control power to an installed cooling fan in accordance with a cooling fan operation table 164 as selected for the controlled cooling fan according to embodiments herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or machine-readable code instructions may be stored.

In other embodiments, dedicated hardware implementations such as application specific integrated circuits (ASICs), programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses hardware resources executing software or firmware, as well as hardware implementations.

When referred to as a "system," a "device," a "module," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a standalone device). The system, device, controller, or module can include hardware processing resources executing software, including firmware embedded at a device, such as an Intel® brand processor, AMD® brand processors, Qualcomm® brand processors, or other processors and chipsets, or other such hardware device capable of operating a relevant software environment of the information handling system. The system, device, controller, or module can also include a combination of the foregoing examples of hardware or hardware executing software or firmware. Note that an information handling system can include an integrated circuit or a board-level product having portions thereof that can also be any combination of hardware and hardware executing software. Devices, modules, hardware resources, or hardware controllers that are in communication with one another need not be in continuous communication with each other, unless expressly specified otherwise. In addition, devices, modules, hardware resources, and hardware controllers that are in communication with one another can communicate directly or indirectly through one or more intermediaries.

Figure 2:
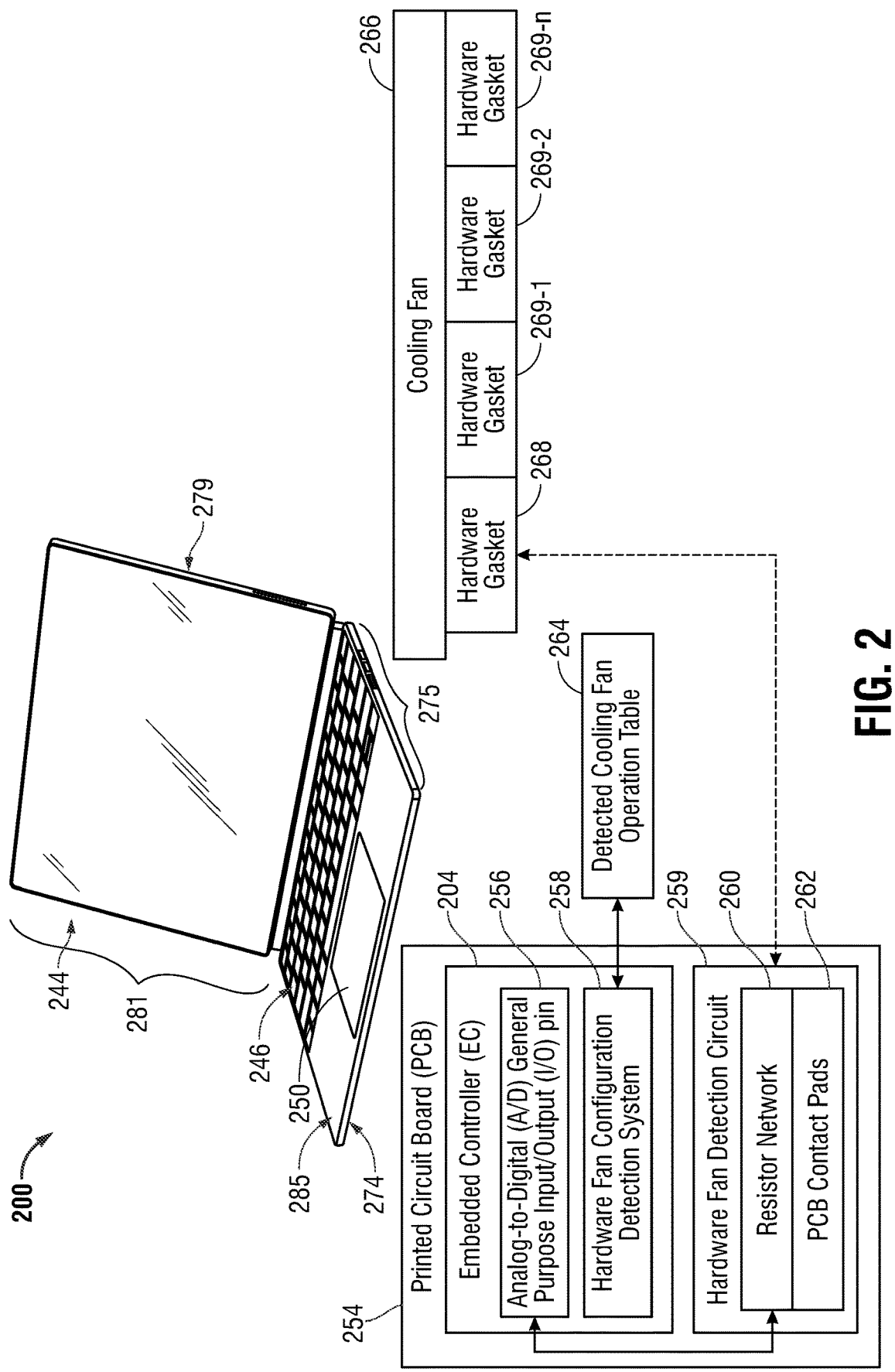
FIG. 2 is a graphic diagram of an information handling system including a hardware fan configuration detection system according to an embodiment of the present disclosure.

FIG. 2 is a graphic diagram of an information handling system 100 including a hardware fan configuration detection system 258 according to an embodiment of the present disclosure. The information handling system 200 may, in an example embodiment, be a laptop-type information handling system 200. Any information handling system 100 may be used with the hardware fan detection circuit 259 and the EC 204 executing code instructions of the hardware fan configuration detection system 158 in embodiments herein.

The information handling system 200 may include a plurality of chassis made of metal, plastic, or the like. The information handling system 200, in one embodiment, may comprise an outer case or shell of an information handling system 200 for housing internal components of the information handling system 200, such as a video display device 244 (e.g., a built-in video display device 244), a cursor control device (e.g., built-in trackpad or touchpad 250), and an alpha numeric input device (e.g., built-in keyboard 291). As shown in FIG. 2, the information handling system 200 may include a built-in video display device 244 functioning to enclose the display chassis 281 with the back display chassis 279 described herein.

As another example embodiment, the information handling system 200 may further include the keyboard chassis 285 functioning to enclose a cursor control device such as a trackpad 250 and/or the built-in keyboard 291 acting as an alpha numeric input device. The back display chassis 279 and the video display device 244 may be joined together in an embodiment to form a fully enclosed display chassis 281, while the keyboard chassis 285 and a bottom chassis 274 may be joined together to form a fully enclosed base chassis 275. Taking a closed configuration as a reference position of the video display device 244 including the back display chassis 279 and the base chassis 275 including the keyboard chassis 285 and bottom chassis 274, the video display device 244 and back display chassis 279 may be rotated away from the base chassis 275 into the laptop configuration as shown in FIG. 2.

The information handling system 200 also includes a printed circuit board (PCB) 254 onto which a hardware fan detection circuit 259 may be formed. The hardware fan detection circuit 259 may include hardware that detects that a cooling fan 266 is installed into the information handling system 200 and identify that cooling fan 266. As described herein this allows for a manufacturer of the information handling system to, for example, detect which vendors' cooling fan has been installed into the information handling system 200 in order to adjust operation of the installed cooling fan accordingly.

In an embodiment, the PCB 254 may house hardware components of the hardware fan detection circuit 259 including an EC 204, a resistor network 260, and one or more PCB contact pads 262 with one or more sub-pad combinations according to embodiments of the present disclosure. The PCB contact pads 262 may be arranged next to the cooling fan 266 installation location such that one or more hardware gaskets 268 formed on the cooling fan 266 may interact with the PCB contact pads 262 as described in various embodiments herein.

In an embodiment, the resistor network 260 formed on the PCB 254 may be a part of a hardware fan detection circuit 259 intermediate to the PCB contact pads 262 and the EC 204. Nodes of the resistor network 260 of the hardware fan detection circuit 259 may be operatively coupled to an analog-to-digital (A/D) general-purpose input output (GPIO) pin of the EC 204 so that a fan contact signal (e.g., a voltage signal) at the resistor network 260 may be converted into a digital signal at the EC 204 for use in determining the type of cooling fan 266 installed in the information handling system 200 by execution of code instructions of the hardware fan configuration detection system 258. The resistor network 260 may include any electrical circuit that includes one or more resistors formed along the resistor network 260 in a resistor divider or resistor ladder and may include other components such as MOSFETs in various embodiments. During operation, the contact and/or orientation of that contact between an identification hardware gasket 268 having a conductive face or surface formed on the cooling fan 266 and the PCB contact pads 262 formed along the resistor network 260 may generate any of a plurality of fan contact signals.

In an example embodiment, the resistor network 260 of the hardware fan detection circuit 159 may include an R-2R resistor ladder network. The R-2R resistor ladder network may include a grounded end with one or more resistor network nodes formed along the resistor network 260 with each of the resistor network nodes terminating at one or more PCB contact pads 262 at each node, and a source voltage and EC 204 operatively coupled to the resistor network 260 of the hardware fan detection circuit 259. In various embodiments, the number of resistor network nodes is two or three. In an embodiment, the portion of the resistor network 260 of the hardware fan detection circuit 259 between the terminal end (e.g., at the PCB contact pads 262) and a first resistor network node in the R-2R resistor ladder network may have a resistor having a resistive value equal to two times those resistors placed between the first resistor network node and a second or subsequent resistor network node. Additionally, each resistor network node may include a 2R resistor operatively coupling the node and each PCB contact pad that has a resistive value equal to two times those resistors (R) placed between the first resistor network node and a second or subsequent resistor network node in an embodiment to form an R-2R ladder. The resistor network node has a number of PCB contact pads 262 with one or more sub-pad configurations operatively coupled to each resistor network. In an embodiment, the number of PCB contact pads 262 formed is three. In other embodiments, the PCB contact pads 262 may each have two or three contact sub-pad portions for an identification hardware gasket of an installed fan to electrically bridge two of the PCB contact sub-pad portions. In an embodiment, an identification hardware gasket may have a conductor to make electrical connection between sub-pads or ground a PCB contact pad for a node. For example, in an In this embodiment, the PCB contact pads 262 may include a grounded PCB contact sub-pad, a source voltage PCB contact sub-pad, and a bit identification PCB contact sub-pad. In an embodiment, each of the grounded PCB contact sub-pad, source voltage PCB contact sub-pad, and bit identification PCB contact sub-pad, are electrically isolated from each other. During operation, when an identification hardware gasket 268 interacts with two of the grounded PCB contact sub-pad, source voltage PCB contact sub-pad, and bit identification PCB contact sub-pad, a voltage may be detected or not detected at that resistor network node operatively coupled to the resistor network 260. For example, where the identification hardware gasket 268 interacts between the grounded PCB contact sub-pad and the bit identification PCB contact pad, a zero voltage is realized at that resistor network node. Additionally, where the hardware gasket 268 interacts between the source voltage PCB contact pad and the bit identification PCB contact sub-pad, a voltage is realized at that resistor network node. The total voltage detected at the A/D GPIO pin 256 of the EC 204 is used to determine which type of cooling fan 266 has been installed. It is appreciated that the number of identification hardware gaskets 269 may be more than one and that each of the PCB contact pads 262 may interface with an identification hardware gasket 268 to either create a lower divided voltage or higher divided voltage at a particular resistor network node such that a total voltage signal detected at the A/D GPIO pin 256 of the EC 204 is used to determine which type of cooling fan 266 has been installed within the information handling system 200. Further, for purposes of the present disclosure, the term "type" when referencing a cooling fan 266 may include different cooling fans models manufactured by different vendors of those cooling fans 266 that may be potentially installed into the information handling system 200.

In another example embodiment, the resistor network 260 of the hardware fan detection circuit 259 may include one or more PCB contact pads 262 placed intermittently between resistors having varying resistance values to form a linear resistor network. In this embodiment an end of the resistor network 260 may be operatively coupled to ground on one node with a source voltage operatively coupled to the other node of the voltage divider. In an embodiment, each of the PCB contact pads 262 may be couplable to ground using an electrical connection via an identification hardware gasket 268 of an installed cooling fan 266. In this embodiment, the identification hardware gasket 268, where present to interact electrically with one or more of the PCB contact pads 262, may include a conductive pad that grounds the PCB contact pads 262 when contacted. A voltage source node on the end of the linear resistor network 260 may be provided and the resistor network 260 may be operatively coupled to the A/D GPIO pin 256 of the EC 204 as described herein. Again, where a voltage level is detected at the A/D GPIO pin 256 of the EC 204, this voltage value may be used to determine which cooling fan 266 is installed in the information handling system 200. In an embodiment, the voltage detected at the A/D GPIO pin 256 of the EC 204 serves as the fan contact signal with the level of voltage being based on which PCB contact pad 262 is grounded within the voltage divider via a conductive surface on the identification hardware gaskets 268 of the installed cooling fan 266. It is appreciated that in this linear resistor network embodiment, the grounding at a first PCB contact pad 262 closest to the voltage source and EC 204 will have a divided voltage higher than a grounding of a subsequent PCB contact pad 262 further distal to the first PCB contact pad 262 along the linear resistor network.

In yet another example embodiment, the resistor network 260 of the hardware fan detection circuit 259 may include an R-2R resistor ladder network modified with one or more metal-oxide-semiconductor field-effect transistors (MOSFETs) formed at each resistor network node. The R-2R resistor ladder network may include a grounded end with one or more resistor network nodes formed along the resistor network 260 and terminating at one or more PCB contact pads 262. In an embodiment, the number of resistor network nodes is three. In one embodiment, the portion of the resistor network 260 between the grounded end and a first resistor network node in the R-2R resistor ladder network may have a resistor having a resistive value equal to two times those resistors placed between the first resistor network node and a second or subsequent resistor network node via a series of nodes. Additionally, each resistor network node may include a resistor having a resistive value equal to two times those resistors placed between the first resistor network node and a second or subsequent resistor network node. At each of each of the resistor network nodes, a number of PCB contact pads 262 are formed each of which may include two sub-pads (e.g., each PCB contact pad 262 divided into two) for at least one identification hardware gasket 268 among the plurality of hardware gaskets 269-1, 269-2, 269-$n$ to bridge a gate voltage at a MOSFET to ground. In this embodiment, the PCB contact pads 262 may include a first PCB contact sub-pad operatively coupled to a gate of the MOSFET and a second PCB contact sub-pad operatively coupled to a source of the MOSFET. During operation, when an identification hardware gasket 268 interacts with the two PCB contact sub-pads of the PCB contact pads 262 by coupling them together thereby shorting (e.g., via a conductive surface on the identification hardware gasket 269) the MOSFET gate to the source and to ground, the MOSFET is turned off thereby providing a logic low voltage on that particular resistor network node. Where no identification hardware gasket 268 shorts a particular set of PCB contact sub-pads of the PCB contact pads 262, a voltage source ($V_{cc}$) will turn on the MOSFET and provide a logic high voltage on that particular resistor network node. The total voltage detected at the A/D GPIO pin 256 from the combination of node values at the EC 204 is used to determine which type of cooling fan 266 has been installed.

The voltage from the resistor network 260 of the hardware fan detection circuit 259 detected at the A/D GPIO pin 256 of the EC 204 is used to determine which type of cooling fan 266 has been installed in the information handling system 200. The computer readable program code of the hardware fan configuration detection system 258 may, when executed by a hardware processing device (e.g., CPU, GPU, EC, microcontroller, and the like), cross-references that detected voltage with a type of cooling fan identified to select a correct detected cooling fan operation table 264. The hardware fan configuration detection system 258 may access a listing of various types of cooling fans 266 as well as a corresponding detected voltage of a received fan contact signal from the hardware fan detection circuit 259. Where a detected voltage of the fan contact signal is associated with a listed type of cooling fan 266, the hardware fan configuration detection system 258 determines that that a particularly-identified cooling fan 266 is currently installed in the information handling system 200. The hardware fan configuration detection system 258 may then cause the cooling fan 266 to be operated according to the particular operating parameters associated with the detected cooling fan 266 with a selected cooling fan operation table 264 for that detected cooling fan 266 and used with a fan or cooling system driver. For example, based on the operating parameters of the detected cooling fan 266 on the detected cooling fan operation table 264, the hardware fan configuration detection system 258, via a hardware processor, operates the cooling fan 266 to increase the RPMs of the cooling fan 266, decrease the RPMs of the cooling fan 266, increase the frequency of initiating the cooling fan 266, or decreasing the frequency of initiating the cooling fan 266, among other operating parameters associated with the operation of the cooling fan 266 in order to optimize the cooling of the hardware within the information handling system 200.

Figure 3:
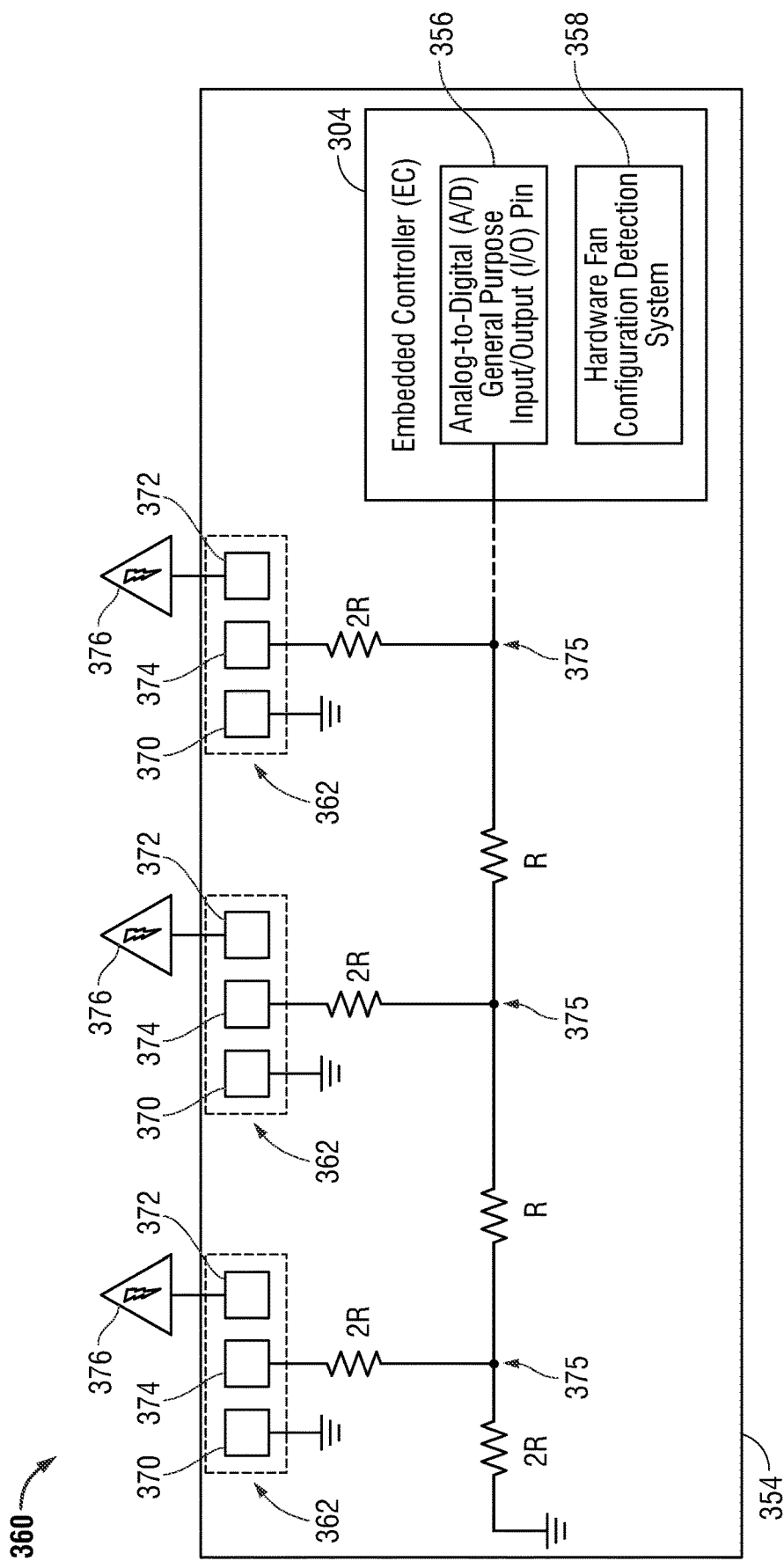
FIG. 3 is a circuit diagram of a resistor network operatively coupled to an embedded controller (EC) operating to detect an installed cooling fan according to an embodiment of the present disclosure.

FIG. 3 is a circuit diagram of a resistor network 360 operatively coupled to an embedded controller (EC) 304 operating to detect an installed cooling fan according to an embodiment of the present disclosure. As described herein, the resistor network 360 may be one of many potential resistor networks 360 that is operatively coupled to the EC 304 of the hardware fan configuration detection system. It is appreciated that the resistor network 360, along with other components of the hardware fan configuration detection system such as the PCB contact pads 362, the EC 304, and grounding sources, may be formed onto a PCB 354 within the information handling system. As described herein, the PCB 354 may be placed near a cooling fan (not shown) when it is installed into the information handling system. This allows a series of one or more identification hardware gaskets of the hardware gaskets associated with the cooling fan to come into physical contact with the PCB contact pads 362 formed onto the PCB 354 and operatively coupled to the resistor network 360 described herein.

In the example presented in FIG. 3, the resistor network 360 is in the form of an R-2R resistor ladder network and is part of the hardware fan detection circuit described in connection with FIG. 1 in one embodiment. This R-2R resistor ladder network implements resistors having two resistive values. A first type of resistor has a base resistive value of "R" while a second type of resistor has a base resistive value of "2R" or two times the first type of resistor. The R-2R resistor ladder network may include a number of nodes 375 as a part of a long string of "R" value resistors. Although FIG. 3 shows three nodes 375 within the resistor network 360, the present specification contemplates that more or fewer nodes 375 may be formed within the R-2R resistor ladder network. It is further appreciated that as the number of nodes 375 increase, the number of potential cooling fans identifiable by the resistor network 360 may be increased. In the example shown in FIG. 3, as the number of PCB contact pads 362 (e.g., number of nodes "n") increases, the number of identifiable cooling fans operatively couplable within the housing of the information handling system with an identification hardware gasket to the hardware fan identification circuit also increases because the number of potentially identifiable cooling fans equals $2^n$ number of cooling fan options. Thus, where 3 sets of PCB contact pads 362 exist (e.g., 3 nodes 375 in the R-2R resistor network 360), the number of identifiable cooling fans is equal to $2^3$ or 8 possible identifiable cooling fans. Additionally, during operation, the R-2R resistor ladder network shown in FIG. 3 provides a way to convert a voltage signal into an equivalent fan detection signal input into the A/D GPIO pin 356 of the EC 304 according to some embodiments herein. The EC 304 may then use the fan detection signal input and execute code instructions of the hardware fan configuration detection system 358 to identify the fan model installed. The hardware fan configuration detection system 358 then selects and retrieves a corresponding detected cooling fan operation table for use by the fan driver and PMU with the installed cooling fan that is identified.

In an embodiment, each of the PCB contact pads 362 and corresponding nodes 375 of the R-2R resistor ladder network may include a grounded PCB contact sub-pad 370, a source voltage PCB contact sub-pad 372, and a bit identification PCB contact sub-pad 374. The layout of the source voltage PCB contact pad 372, the bit identification PCB contact pad 374, and the grounded PCB contact pad 370 are such that an identification hardware gasket (not shown) having a conductive surface layer thereon and operatively coupled to the cooling fan can span two of these three sub-pads 370, 372, 374 at the PCB contact pad 362. The grounded PCB contact sub-pad 370 may be grounded to a grounding source on the PCB 354 in an example embodiment. The source voltage PCB contact sub-pad 372 may be operatively coupled to a voltage source on the PCB 354 in an example embodiment. The bit identification PCB contact sub-pad 374 may be operatively coupled to the resistor network 360.

Because the bit identification PCB contact sub-pad 374 is placed intermediate to the source voltage PCB contact sub-pad 372 and the grounded PCB contact sub-pad 370, the identification hardware gasket may be formed to always contact the bit identification PCB contact sub-pad 374 and one of the grounded PCB contact sub-pad 370 or the source voltage PCB contact sub-pad 372. For example, where an identification hardware gasket spans the grounded PCB contact sub-pad 370 and the bit identification PCB contact sub-pad 374 at a certain node 375, that node 375 will register a 0 or another low voltage because the bit identification PCB contact sub-pad 374 has been electrically coupled to the grounded PCB contact sub-pad 370 via the conductive surface formed on the identification hardware gasket on the cooling fan pulling the corresponding node 375 low. Additionally, wherein the identification hardware gasket spans the source voltage PCB contact sub-pad 372 and the bit identification PCB contact sub-pad 374 at a certain node 375, this provides a relatively higher voltage relative to that provided by the grounded PCB contact sub-pad 370 above at that particular node 375 along the resistor network 360 because the bit identification PCB contact sub-pad 374 has been electrically coupled to the source voltage PCB contact sub-pad 372 via the conductive surface formed on the identification hardware gasket on the cooling fan pulling the corresponding node 375 high.

As the plurality of the hardware gaskets (e.g., identification hardware gaskets including a conductive layer) from various types of hardware cooling fan types that may be installed interface with each of the PCB contact pads 362, an output voltage is realized at the A/D GPIO pin 356 as a fan contact signal from the resistor network 360 operatively coupled to the A/D GPIO pin 356. Depending on the voltage level detected at the A/D GPIO pin 356, the EC 304 may be capable of determining which of a plurality of different types of cooling fans is operatively coupled within the housing of the information handling system. Following the example shown in FIG. 3 of three PCB contact pads 362 formed within the resistor network 360, the number of potential analog voltage values detected is eight. Below is an example table of a detected cooling fan operation table (e.g., FIG. 1, 164) that the EC 304 may use to, based on the detected voltage, determine which type of cooling fan is installed within the housing of the information handling system.

TABLE 1

| Bit | Voltage (V) | EC detected cooling fan |
|---|---|---|
| 111 | 2.8875 | Fan Vendor #1 |
| 110 | 2.475 | Fan Vendor #2 |
| 101 | 2.0625 | Fan Vendor #3 |
| 100 | 1.75 | Fan Vendor #4 |
| 011 | 1.2375 | Fan Vendor #5 |
| 010 | 0.85 | Fan Vendor #6 |
| 001 | 0.4125 | Fan Vendor #7 |
| 000 | 0 | Default |

Again, it is appreciated that although different fan types may be determined, these fan types may be arranged into fan vendors who produce fans used for installation into the housing of the information handling system. Further, these fan vendors may produce fans with a unique identification hardware gasket or arrangement of hardware gaskets formed off of the hardware cooling fan housing that are unique to each vendor model cooling fan type. The "Default" value may represent a situation where the PCB contact pad 370 is not contacted at all (i.e., no identification hardware gasket) or not contacted well during installation of the cooling fan with its hardware gaskets or may represent a low voltage value at each of the nodes 375 corresponding to the PCB contact pads 362. It is appreciated that the number of detectable cooling fan vendors may be increased as the number of nodes 375 or corresponding PCB contact pads 362 (and also the number of resistor network nodes 375) increases. Still further, it is appreciated that, in the example embodiment shown in FIG. 3, all of the hardware gaskets formed on the cooling fan act as an identification hardware gasket that includes a conductive surface to electrically couple the bit identification PCB contact sub-pad 374 to either of the source voltage PCB contact sub-pad 372 or grounded PCB contact sub-pad 370 at each resistor network node 375. As described or shown in embodiments herein, the hardware gaskets, including any identification hardware gaskets with conductive or grounded contact surfaces, may be formed as an extension of the hardware cooling fan housing and that extends over the PCB contact pad or pads 362 on the PCB 354 when the hardware cooling fan is installed according to various embodiments herein.

Figure 4:
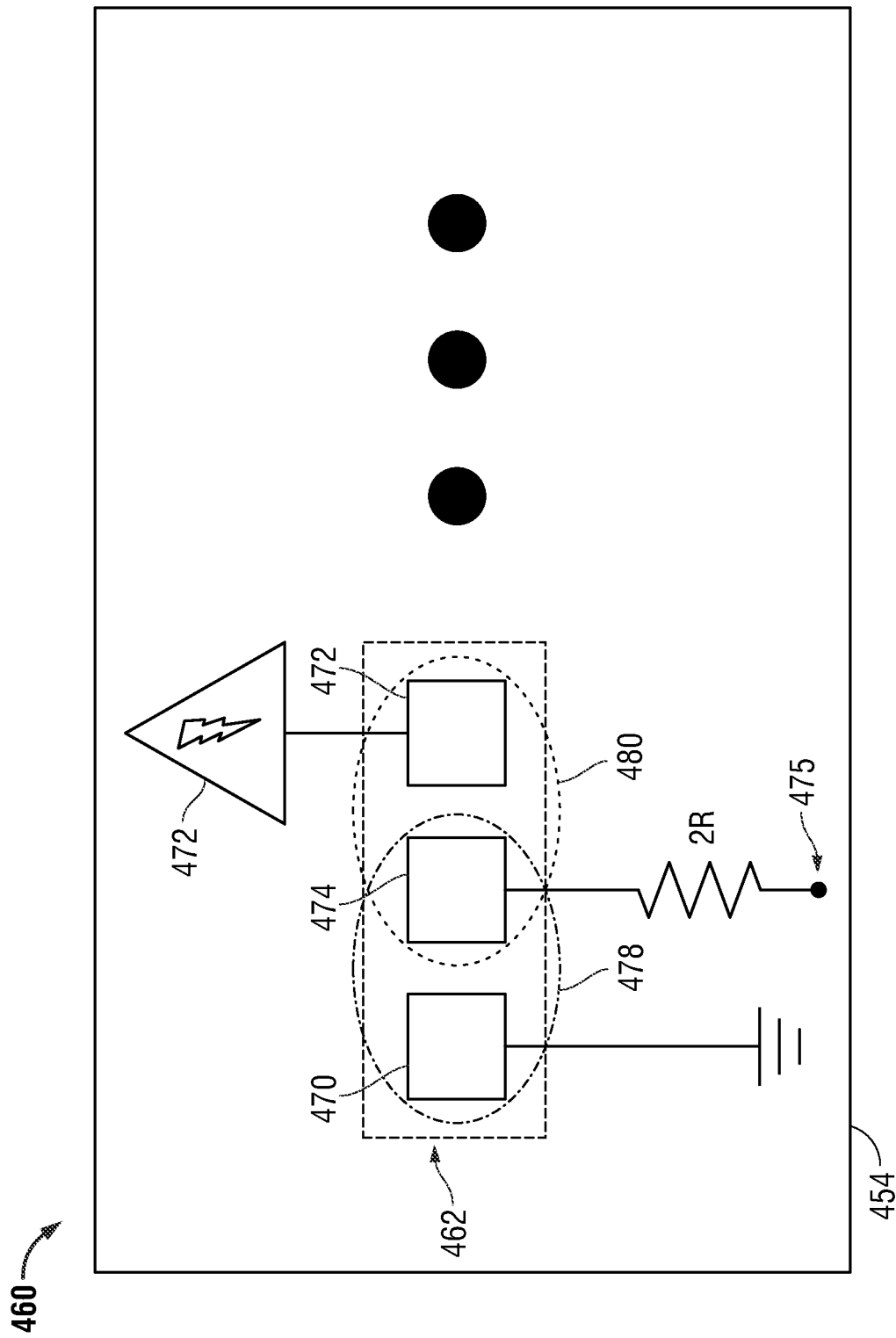
FIG. 4 is a graphic diagram of example hardware gasket locations of a hardware gasket of an installed cooling fan as it would interface with printed circuit board (PCB contact pads formed on a PCB and operatively coupled to a resistor network according to an embodiment of the present disclosure.

FIG. 4 is a graphic diagram of a PCB contact pad 462 with example identification hardware gasket locations 478, 480 of a hardware gasket (not shown) formed on an installed cooling fan (not shown) as it would interface with the PCB contact pads 462 formed on a PCB 454. Again, the PCB contact pads 462 are operatively coupled to a resistor network of the hardware fan detection circuit at their respective nodes 475 as shown in part with the 2R resistor according to an embodiment of the present disclosure such as described above with FIG. 3. FIG. 4 is a larger view of one of the PCB contact pads 462 of the hardware fan detection circuit shown in FIG. 3 (e.g., FIG. 3, 362) and shows the spanning locations of the identification hardware gaskets of the installed cooling fan as they would interface with the PCB contact pad 462 to provide a high voltage or a low voltage (e.g., no voltage or low voltage) to the resistor network at the node below the shown PCB contact pad 462.

In an embodiment, each of the PCB contact pads 462 with corresponding nodes 475 of the R-2R resistor ladder network may include a grounded PCB contact sub-pad 470, a source voltage PCB contact sub-pad 472, and a bit identification PCB contact sub-pad 474. The layout of the source voltage PCB contact pad 472, the bit identification PCB contact pad 474, and the grounded PCB contact pad 470 are such that an identification hardware gasket (not shown) having a conductive surface layer thereon and operatively coupled to the cooling fan can span two of these sub-pads 470, 472, 474. The grounded PCB contact sub-pad 470 may be grounded to a grounding source on the PCB 454 in an example embodiment. The source voltage PCB contact sub-pad 472 may be operatively coupled to a voltage source on the PCB 454 in an example embodiment. The bit identification PCB contact sub-pad 474 may be operatively coupled to the resistor network 460 via node 475.

Because the bit identification PCB contact sub-pad 474 is placed intermediate to the source voltage PCB contact sub-pad 472 and the grounded PCB contact sub-pad 470, the identification hardware gasket may be formed to always contact the bit identification PCB contact sub-pad 474 and one of the grounded PCB contact sub-pad 470 or the source voltage PCB contact sub-pad 472. For example, where an identification hardware gasket spans the grounded PCB contact sub-pad 470 and the bit identification PCB contact sub-pad 474 at a certain node 475, that node 475 will register a 0 or low voltage because the bit identification PCB contact sub-pad 474 has been electrically coupled to the grounded PCB contact sub-pad 470 via the conductive surface formed on the identification hardware gasket on the cooling fan. Additionally, wherein the identification hardware gasket spans the source voltage PCB contact sub-pad 472 and the bit identification PCB contact sub-pad 474 at a certain node 475, this provides a high voltage at that particular node 475 along the resistor network 460 because the bit identification PCB contact sub-pad 474 has been electrically coupled to the source voltage PCB contact sub-pad 472 via the conductive surface formed on the identification hardware gasket on the cooling fan.

As the one or more identification hardware gaskets (e.g., identification hardware gaskets including a conductive layer) interface with each of the PCB contact pads 462 and some portion of sub-pads, fan detection signal is realized at the A/D GPIO pin 456 from the coupled resistor network. Depending on the voltage level detected at the A/D GPIO pin 456, the EC 404 may be capable of determining which of a plurality of different types of cooling fans is operatively coupled within the housing of the information handling system. Following the example shown in FIG. 3 of three PCB contact pads 462 formed within the resistor network, the number of potential analog voltage values detected is eight. Table 1 described herein is a detected cooling fan operation table (e.g., FIG. 1, 164) that the EC may use to, based on the detected voltage that is a fan detection signal, determine which type of cooling fan is installed within the housing of the information handling system. With this determination, a fan operating table may be selected that is specific for the determined hardware cooling fan installed and use with the fan driver and PMU of the information handling system to optimize the cooling capabilities specific to the installed type of hardware cooling fan.

Again, it is appreciated that although different hardware fan types may be determined, these hardware cooling fan types may be different among fan vendors who produce those hardware cooling fans and each type of hardware cooling fan may have a unique arrangement one or more identification hardware gaskets used for installation into the housing of the information handling system. Additionally, it is appreciated that the number of detectable cooling fan vendors may be increased as the number of resistor network nodes 475 corresponding to PCB contact pads 462 increases.

Figure 5:
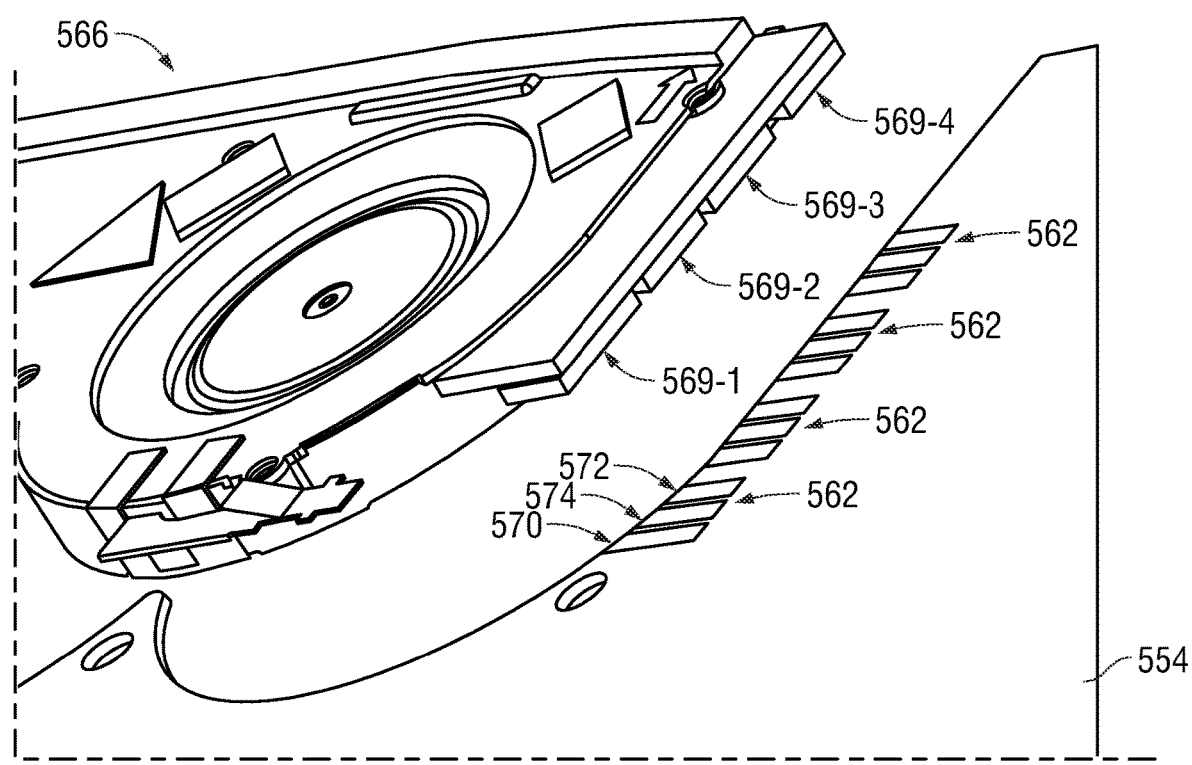
FIG. 5 is a graphic diagram of a PCB having a plurality of PCB contact pads of a resistor network and a cooling fan having a plurality of hardware gaskets according to an embodiment of the present disclosure.

FIG. 5 is a graphic diagram of a PCB 554 having a plurality of PCB contact pads 562 operatively coupled a resistor network (not shown) of a hardware fan detection circuit and a cooling fan 566 according to an embodiment of the present disclosure. The hardware cooling fan 566 includes a plurality of hardware gaskets 569-1, 569-2, 569-3, 569-4, including at least one identification hardware gasket for alignment over the PCB contact pads 562. Hardware cooling fan 566 may include any number of hardware gaskets 569-1, 569-2, 569-3, 569-4 with any one or plurality of the hardware gaskets having a conductive surface that makes it an identification hardware gasket for connecting sub-pads of any one or more of the PCB contact pads 562.

In the embodiment shown in FIG. 5, the cooling fan 566 may include an outer housing that houses the rotating fan used to dissipate heat accumulated within a housing of the information handling system. The cooling fan 566 further includes one or more surfaces that extend out from the housing of the cooling fan 566 to form hardware gasket holders for hardware gaskets 569-1, 569-2, 569-3, 569-4, in an example embodiment. As shown, this extension of the housing of the cooling fan 566 may extend out from the housing and towards or above the PCB 554 on which the resistor network (not shown) and PCB contact pads 562 have been formed when the hardware cooling fan 566 is installed.

In the example shown in FIG. 5, the number of PCB contact pads 562 is four. As described in one embodiment herein, each of the PCB contact pads 562 includes a grounded PCB contact sub-pad 570, a source voltage PCB contact sub-pad 572, and a bit identification PCB contact sub-pad 574. In an embodiment, each of the PCB contact pads 562 are formed at a terminal ends operatively coupled to the nodes of the R-2R resistor ladder network. The layout of the source voltage PCB contact sub-pad 572, the bit identification PCB contact sub-pad 574, and the grounded PCB contact sub-pad 570 are such that an identification hardware gasket of any of the hardware gaskets 569-1, 569-2, 569-3, 569-4 operatively coupled to the cooling fan can span from the bit identification PCB contact sub-pad 574 to either of the grounded PCB contact sub-pad 570 or the source voltage PCB contact sub-pad 572. It is appreciated that hardware cooling fans 566 need not have all of the hardware gaskets 569-1, 569-2, 569-3, 569-4 as shown in the exemplary embodiment of FIG. 5 and may have fewer, including only have one hardware gasket, from among the plurality of hardware gaskets 569-1, 569-2, 569-3, 569-4 shown in various other embodiments. The grounded PCB contact sub-pad 570 may be grounded to a grounding source on the PCB 554. The source voltage PCB contact sub-pad 572 may be operatively coupled to a voltage source on the PCB 554. The bit identification PCB contact sub-pad 574 may be operatively coupled to the resistor network 560 as described herein.

During installment of the cooling fan, for example, where one of the hardware gaskets 569-1, 569-2, 569-3, 569-4 is an identification hardware gasket with a conductive surface that spans the grounded PCB contact sub-pad 570 and the bit identification PCB contact sub-pad 574 at a PCB contact pad 562 corresponding to a certain node, that node will register a 0 or low voltage because the bit identification PCB contact sub-pad 574 has been electrically coupled to the grounded PCB contact sub-pad 570 via the conductive surface formed on the identification hardware gasket selected from the hardware gaskets 569-1, 569-2, 569-3, 569-4 shown on the cooling fan of FIG. 5. Additionally, wherein the identification hardware gasket from the hardware gaskets 569-1, 569-2, 569-3, 569-4 shown spans the source voltage PCB contact sub-pad 572 and the bit identification PCB contact sub-pad 574 at a PCB contact pad 562 corresponding to a certain node, this provides a high voltage at that particular node along the resistor network because the bit identification PCB contact sub-pad 574 has been electrically coupled to the source voltage PCB contact sub-pad 572 via the conductive surface formed on the identification hardware gasket from among the hardware gaskets 569-1, 569-2, 569-3, 569-4 on the cooling fan shown in FIG. 5. Again, fewer hardware gaskets 569-1, 569-2, 569-3, 569-4, including just one hardware gasket, may be formed on any given hardware fan model to be installed in various embodiments.

As the plurality of the possible identification hardware gaskets that may be any one of the hardware gaskets 569-1, 569-2, 569-3, 569-4 shown in FIG. 5 interface with each of their respective PCB contact pads 562, the individual identification hardware gasket from any of the hardware gaskets 569-1, 569-2, 569-3, 569-4 are sized to span with a conductive surface any two of the respective grounded PCB contact sub-pad 570, source voltage PCB contact sub-pad 572, and bit identification PCB contact sub-pad 574 used to identify the vendor (e.g., manufacturer) or type of cooling fan 566 installed. Additionally, as the identification hardware gasket of any of the shown hardware gaskets 569-1, 569-2, 569-3, 569-4 interface with each of their respective PCB contact pads 562, an output voltage is realized that serves as a fan contact signal at the A/D GPIO pin (not shown) of the EC (not shown) to which the resistor network is operatively coupled to. Depending on the fan contact signal (e.g., a voltage signal) detected at the A/D GPIO pin from this hardware fan detection circuit, the EC may be capable of determining which of a plurality of different cooling fans (e.g., vendor, type, etc.) is operatively coupled within the housing of the information handling system. The EC may then execute code instructions of the hardware fan configuration detection system to select a detected cooling fan operating table that is to be used with the installed cooling fan as detected by the fan driver and PMU.

In an example embodiment as shown, four PCB contact pads 562 are shown in FIG. 5. Thus, the number of potential voltage values detected is $2^4$ or 16. Additionally, similar to Table 1 described herein, a table comprising 16 possible detected output voltages may be provided and accessed by the EC as a hardware fan contact signal in order to determine which detected voltage or fan contact signal correlates with which vendor or type of cooling fan 566 installed. Again, it is appreciated that although different fan types may be determined, these fan types may be arranged into fan vendors who produce fans used for installation into the housing of the information handling system. Each fan vendor or model may have a signal identification hardware gasket among the possible hardware gaskets 569-1, 569-2, 569-3, 569-4 shown in FIG. 5 that is different from other fan vendors. It is also appreciated that the number of detectable cooling fan vendors may be increased as the number of nodes or PCB contact pads 562 increases. Any fan model may have only one or more hardware gaskets 569-1, 569-2, 569-3, 569-4 but fewer or more than those shown. Further, only one or a subset of the plurality of hardware gaskets 569-1, 569-2, 569-3, 569-4, if a fan has a plurality of hardware gaskets may be an identification hardware gasket with a conductive surface in various embodiments.

It is further appreciated that the location of the PCB contact pads 562 on the PCB 554 may vary so long as the PCB contact pads 562 are operatively coupled to the resistor network of the hardware fan detection circuit described in embodiments herein. In an example embodiment, the PCB contact pads 562 may be formed around a hole formed through the PCB 554 which is meant to receive a screw or other fastener used to secure the cooling fan 566 to the PCB 554 or other housing structure within the information handling system. Accordingly, the housing of the cooling fan 566 may include identification hardware gaskets 569-1, 569-2, 569-3, 569-4 formed around a matching screw hole used to pass a screw or other fastener through and into the PCB 554 or housing of the information handling system. In this example embodiment, therefore, the alignment of the identification hardware gaskets 569-1, 569-2, 569-3, 569-4 to the PCB contact pads 562 is better due to the physical alignment of the cooling fan 566 to the PCB 554 using the screw or other fastener. Additionally, the size of the PCB contact pads 562 and hardware gaskets 568 or their number may such that space on the PCB 554 is conserved or used efficiently within the limited space confines of an information handling system such as a portable laptop type information handling system.

Figure 6:
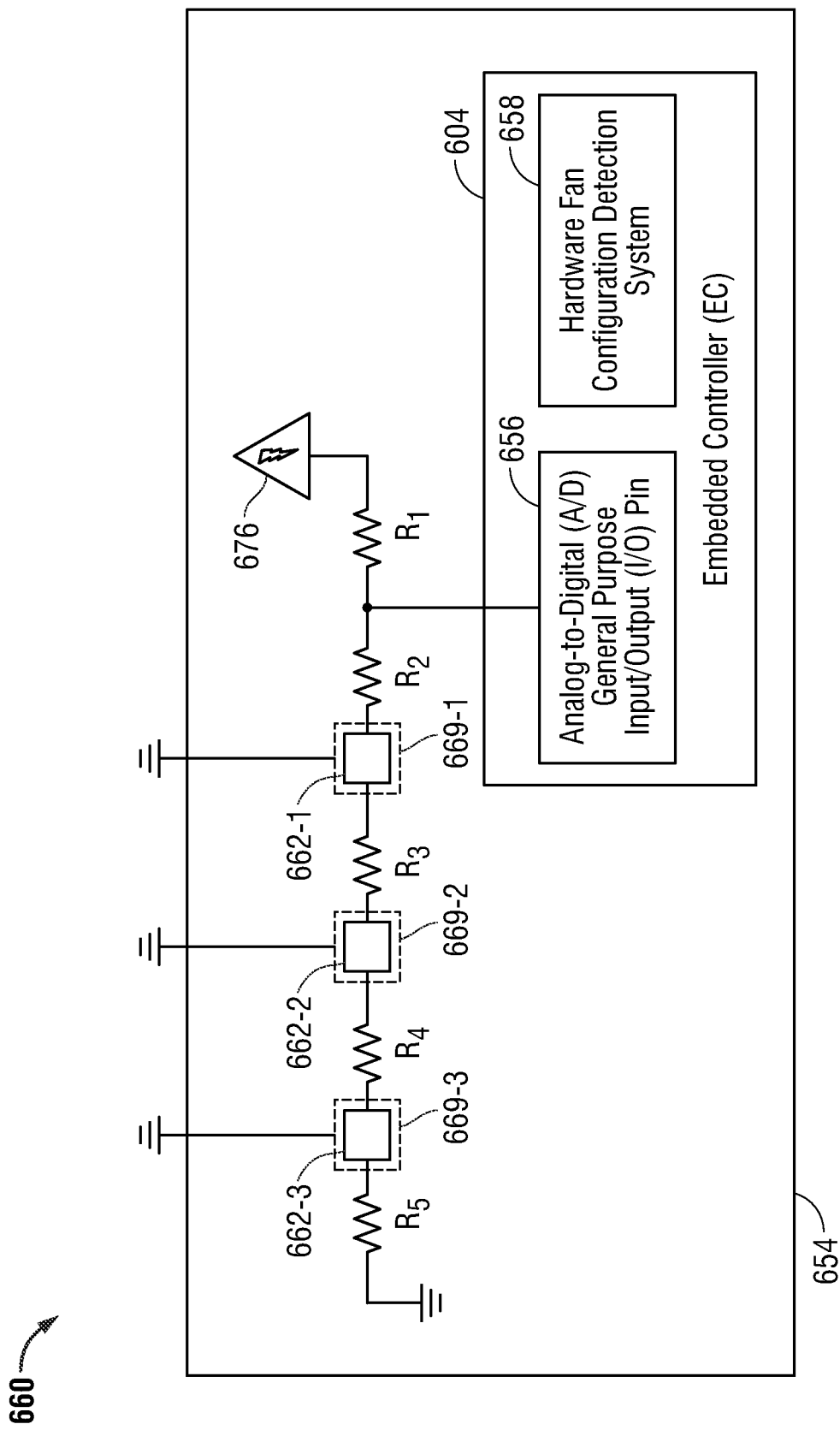
FIG. 6 is a circuit diagram of a resistor network operatively coupled to an EC operating to detect an installed cooling fan according to another embodiment of the present disclosure.

FIG. 6 is a circuit diagram of a resistor network 660 of a hardware fan detection circuit operatively coupled to an EC 604 operating to detect an installed cooling fan (not shown) according to another embodiment of the present disclosure. As described herein, the resistor network 660 may be one of many potential resistor networks for embodiment hardware fan detection circuits 660 that are operatively coupled to the EC 604 of the hardware fan configuration detection system. It is appreciated that the resistor network of the hardware fan detection circuit 660, along with other components of the hardware fan configuration detection system such as the PCB contact pads 662-1, 662-2, 662-3, the EC 604, and grounding sources, may be formed onto a PCB 654 within the information handling system. As described herein, the PCB 654 may be placed near a cooling fan (not shown) installed into the information handling system. This allows a series of one or more hardware gaskets (not shown), any one or more of which may be an identification hardware gasket, associated with the cooling fan to come into physical contact with the PCB contact pads 662-1, 662-2, 662-3 formed onto the PCB 654 and operatively coupled to the resistor network of the hardware fan detection circuit 660 described herein.

In the example presented in FIG. 6, the resistor network of the hardware fan detection circuit 660 is in the form of a linear resistor divider network. This linear resistor divider network of the hardware fan detection circuit 660 may be used to detect as many different types or vendors of an installed cooling fan as the number of PCB contact pads 662-1, 662-2, 662-3 are presented along the resistor network in the hardware fan detection circuit of the hardware fan detection circuit 660. This is because any single identification hardware gasket located at any hardware gasket location 669-1, 669-2, 669-3 (shown in dashed lines and coupled to ground to form a node when in contact) are operatively coupled to the installed cooling fan, where present, and are used as a grounding source to form nodes along the resistor divider network shown in FIG. 6.

In the example embodiment shown in FIG. 6, the resistor network of the hardware fan detection circuit 660 may include one or more PCB contact pads 662-1, 662-2, 662-3 placed, intermittently, between resistors having varying resistance values to form the linear resistor network. In this embodiment, an end of the resistor network of the hardware fan detection circuit 660 may be operatively coupled to ground on one end node with a source voltage operatively coupled to the other end node of the linear voltage divider. In an embodiment, each of the PCB contact pads 662-1, 662-2, 662-3 may be couplable to ground using an electrical connection via an identification hardware gasket at any of the locations 669-1, 669-2, or 669-3 of an installed cooling fan (not shown). In this embodiment, the identification hardware gasket at any of the locations 669-1, 669-2, or 669-3 of an installed cooling fan interacts electrically with one or more of the PCB contact pads 662-1, 662-2, 662-3 with a conductive pad that grounds the PCB contact pads 662-1, 662-2, 662-3 when the identification hardware gasket is placed at an location 669-1, 669-2, 669-3 and comes into contact with the PCB contact pads 662-1, 662-2, 662-3. A voltage source node on the end of the linear resistor network of the hardware fan detection circuit 660 may be provided and a node of the resistor network of the hardware fan detection circuit 660 may be operatively coupled to the A/D GPIO pin 656 of the EC 604 as described herein. Again, where a voltage level is detected at the A/D GPIO pin 656 of the EC 604, this voltage value may be used as a fan contact signal to determine which type of hardware cooling fan is installed in the information handling system. In an embodiment, the voltage detected at the A/D GPIO pin 656 of the EC 604 serves as the fan contact signal with the level of voltage being based on which PCB contact pad 662-1, 662-2, 662-3 is grounded within the linear voltage divider via a conductive surface on the identification hardware gasket at any location 669-1, 669-2, or 669-3 upon installation of the installed cooling fan. It is appreciated that in this linear resistor network embodiment, the grounding at a first PCB contact pad (e.g., 669-1) closest to the voltage source 676 and EC 604 will have a divided voltage higher than a grounding of a subsequent PCB contact pad (e.g., 669-2) at a node further distal from the node for the A/D GPIO pin 656 along the linear resistor network.

In this example embodiment, where a hardware gaskets contact location, among those as depicted at 669-1, 669-2, 669-3, couple any of the PCB contact pads 662-1, 662-2, 662-3 to ground via the cooling fan, they are referred to herein as an identification hardware gasket contacting at node locations 669-1, 669-2, 669-3. The identification hardware gasket may be conductive and ground the node location 669-1, 669-2, 669-3 and any corresponding PCB contact pad 662-1, 662-2, or 662-3. In an embodiment, however, a hardware gasket 669-1, 669-2, 669-3 may not be present and, therefore, a conductive surface is not in contact with any PCB contact pad 662-1, 662-2, 662-3 in order to ground that PCB contact pad 662-1, 662-2, 662-3. In one embodiment, a hardware gasket 669-1, 669-2, 669-3 may be present but may lack a conductive surface that grounds a PCB contact pad 662-1, 662-2, 662-3 and instead may be replaced with a non-conductive surface such as rubber. In the example shown in FIG. 6, the presence of a first identification hardware gasket 669-1 at a first PCB contact pad 669-1 may indicate that the cooling fan is made by a first vendor or is a first type of cooling fan. This is because the resistance of a first resistor (e.g., $R_1$) and a second resistor (e.g., $R_2$) determines the ratio between $V_{in}$ 676 and $V_{out}$ or the voltage detected at the A/D GPIO pin 656. Additionally, the absence of a first hardware gasket 669-1 at the first PCB contact pad 662-1 but the presence of a second hardware gasket 669-2 at a second PCB contact pad 662-2 may indicate that the cooling fan is made by a second vendor or is a second type of cooling fan. This is because the resistance of the first resistor (e.g., $R_1$), the second resistor (e.g., $R_2$), and a third resistor (e.g., $R_3$) determines the ratio between $V_{in}$ 676 and $V_{out}$ or the voltage detected at the A/D GPIO pin 656. Still further, the absence of a first identification hardware gasket 662-1 at the first PCB contact pad 662-1 and the second identification hardware gasket 662-2 at the second PCB contact pad 662-2 but the presence of a third identification hardware gasket 662-3 at a third PCB contact pad 662-3 may indicate that the cooling fan is made by a third vendor or is a third type of cooling fan. This is because the resistance of the first resistor (e.g., $R_1$), the second resistor (e.g., $R_2$), a third resistor (e.g., $R_3$), and a fourth resistor (e.g., $R_4$) determines the ratio between $V_{in}$ 676 and $V_{out}$ or the voltage detected at the A/D GPIO pin 656. It is appreciated that, in an embodiment, no identification hardware gaskets 669-1, 669-2, 669-3 are present, thereby creating a fourth voltage level at the A/D GPIO pin 656 indicating a fourth vendor or fourth type of cooling fan installed in the information handling system or a default cooling fan operating table is to be used. In this manner, each vendor may be assigned to provide either of a first identification hardware gasket 669-1, a second identification hardware gasket 669-2, a third identification hardware gasket 669-3, or no identification hardware gasket in this example embodiment, so that the EC 604 can determine which cooling fan is installed as described herein and select a corresponding installed cooling fan operation table for use with a fan driver or PMU. Again, a cooling fan operation table may be accessed for the identified hardware cooling fan installed. The fan contact signal received from the hardware fan detection circuit 660 is used to determine which cooling fan vendor and model are installed based on the fan contact signal received at the EC 604. When the fan type or fan vendor is determined, the hardware fan configuration detection system may be executed to cause the cooling fan to be operated according to the particular operating parameters of its installed cooling fan operation table that is associated with the detected cooling fan and used with a fan or cooling system driver and PMU to regulate or adjust for capabilities in fan speeds, airflow volumes, or the like.

Figure 7:
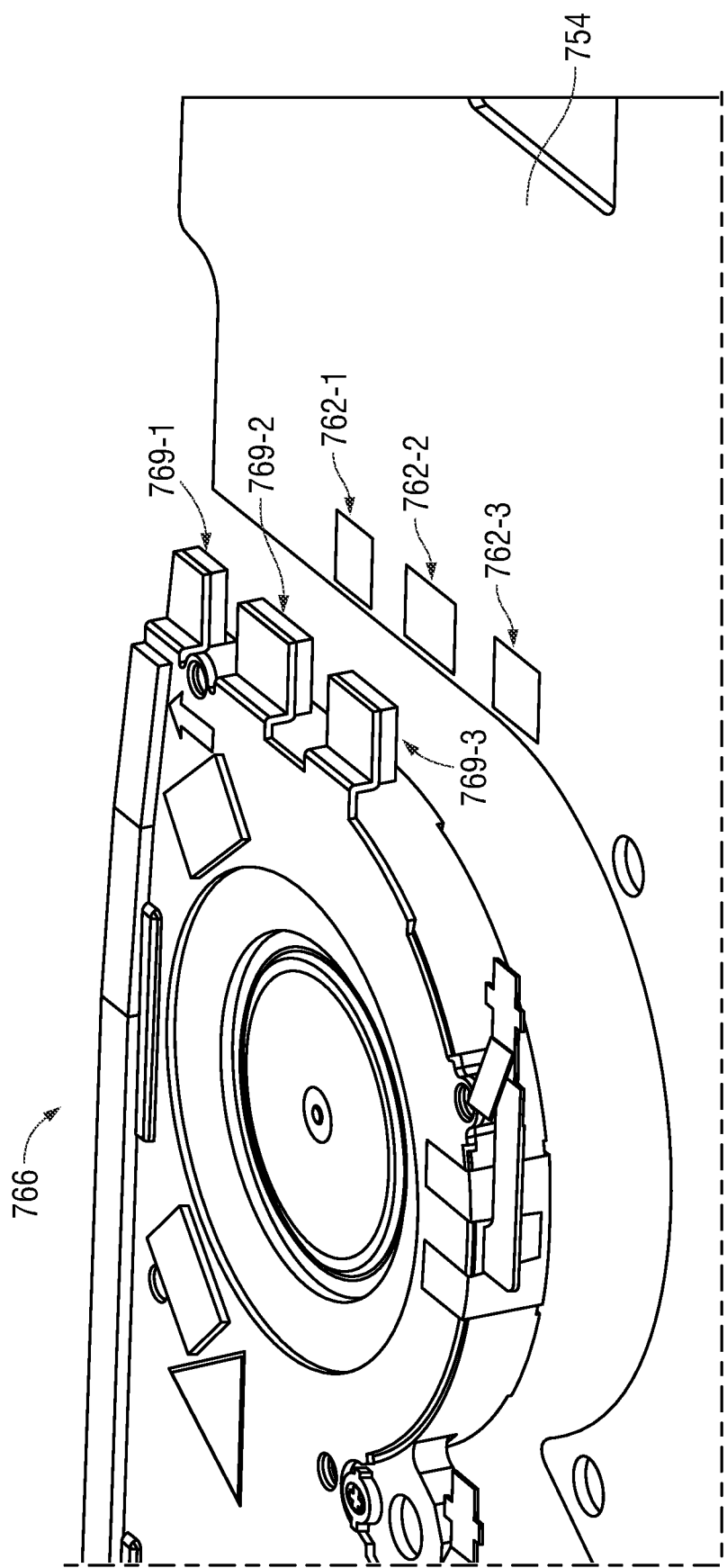
FIG. 7 is a graphic diagram of a PCB having a plurality of PCB contact pads of a resistor network and a cooling fan having a plurality of hardware gaskets according to another embodiment of the present disclosure.

FIG. 7 is a graphic diagram of a PCB 754 having a plurality of PCB contact pads 762-1, 762-2, 762-3 operably coupled to a resistor network (not shown) of a hardware fan detection circuit and a cooling fan 766 having a plurality of hardware gaskets 769-1, 769-2, 769-3 according to another embodiment of the present disclosure. It is appreciated that cooling fan 766 may have any number of hardware gaskets 769-1, 769-2, 769-3 as extended protrusion platforms from the housing of cooling fan 766. The one or more hardware gaskets 769-1, 769-2, 769-3 may be used in part in some embodiments to secure installation of the cooling fan 766. The one or more hardware gaskets 769-1, 769-2, 769-3 may include a hardware gasket interface surface that operatively couples to a corresponding PCB contact pad 762-1, 762-2, or 762-3. In embodiments herein, cooling fan 766 may have only one identification hardware gasket with a conductive hardware gasket interface surface such that when in contact with one of the corresponding PCB contact pads may identify the type of hardware cooling fan 766 installed in the information handling system.

In the embodiment shown in FIG. 7, the cooling fan 766 may include an outer housing that houses the rotating fan used to dissipate heat accumulated within a housing of the information handling system. The cooling fan 766 further includes one or more gasket interface surfaces on protrusions that extend out from the housing of the cooling fan 766, in an example embodiment, forming the one or more hardware gaskets 769-1, 769-2, 769-3. As shown, this extension of the housing of the cooling fan 766 may extend out from the housing and towards or above the PCB 754 on which the resistor network (not shown) and PCB contact pads 762-1, 762-2, 762-3 have been formed.

In the example presented in FIG. 7, the resistor network (not shown) is in the form of a linear resistor divider network. This linear resistor divider network may be used to detect as many different types or vendors of an installed cooling fan 766 as the number of PCB contact pads 762-1, 762-2, 762-3 are presented along the resistor network. This is because the identification hardware gasket with the conductive gasket interface surface that may be any one of the hardware gaskets 769-1, 769-2, 769-3 operatively coupled to the installed cooling fan 766, where present, is used to ground a node in the resistor network associated with a corresponding PCB contact pad 762-1, 762-2, or 762-3. The identification hardware gasket may serve as a grounding source along the linear resistor divider network shown in FIG. 6 for example to ground a corresponding node for the PCB contact pad of the hardware fan detection circuit. In an embodiment, the outer housing of the cooling fan 766 is part of an EMI shield that is tied to ground and the identification hardware gasket has a conductive gasket interface surface that is an extension of that EMI shield of the cooling fan 766 that is grounded. Where an identification hardware gasket among hardware gaskets 769-1, 769-2, 769-3 is not present or a good contact is not made to ground any one of the PCB contact pads 762-1, 762-2, 762-3, the output voltage at the A/D GPIO pin (not shown) of the EC (not shown) from the hardware fan detection circuit may detect a relatively lower voltage due to the inclusion of additional resistors on the linear resistor divider network and serve as a default fan contact signal. In the example shown in FIG. 7, the presence of a first identification hardware gasket 769-1 at a first PCB contact pad 762-1 may indicate that the cooling fan 766 is made by a first vendor or is a first type of cooling fan 766. In this example embodiment, the second and third PCB contact pads 762-2, 762-3 may not be present or may not be conductive and the linear resistor divider network is grounded at node corresponding to the first PCB contact pad 762-1. By not including these extra hardware gaskets 769-2, 769-3 the costs associated with manufacture of the cooling fan 766 may be reduced. The indication of the first vendor via the inclusion of the first hardware gasket 769-1 is accomplished via the resistance of a first resistor (e.g., $R_1$) and a second resistor (e.g., $R_2$) determining the ratio between $V_{in}$ and $V_{out}$ or the voltage detected as a hardware fan contact signal at the A/D GPIO pin.

Additionally, the absence of a first hardware gasket 769-1 to ground the node at the first PCB contact pad 662-1 but the presence of a second hardware gasket 769-2 to ground the node at a second PCB contact pad 762-2 may indicate that the cooling fan is made by a second vendor or is a second type of cooling fan. This is because the resistance of the first resistor (e.g., $R_1$), the second resistor (e.g., $R_2$), and a third resistor (e.g., $R_3$) determines the ratio between $V_{in}$ 776 and $V_{out}$ or the voltage detected as the hardware fan contact signal at the A/D GPIO pin. Still further, the absence of a first identification hardware gasket 762-1 to ground a node at the first PCB contact pad 762-1 and the second identification hardware gasket 762-2 to ground a node at the second PCB contact pad 762-2 but the presence of a third identification hardware gasket 762-3 to ground the node at a third PCB contact pad 762-3 may indicate that the cooling fan is made by a third vendor or is a third type of cooling fan. This is because the resistance of the first resistor (e.g., $R_1$), the second resistor (e.g., $R_2$), a third resistor (e.g., $R_3$), and a fourth resistor (e.g., $R_4$) determines the ratio between $V_{in}$ 776 and $V_{out}$ or the voltage detected as the hardware fan contact signal at the A/D GPIO pin. It is appreciated that, in an embodiment, no identification hardware gaskets 769-1, 769-2, 769-3 are present, thereby creating a fourth voltage level at the A/D GPIO pin indicating a default fan contact signal or even a fourth vendor or fourth type of cooling fan installed in the information handling system. In this manner, each vendor may be assigned to provide either of a first identification hardware gasket 769-1, a second identification hardware gasket 769-2, a third identification hardware gasket 769-3, or in some embodiments no identification hardware gasket in this example embodiment, so that the EC can determine which cooling fan is installed as described herein via a table of fan contact signal values. Again, the EC may execute code instructions of a hardware fan configuration detection system to determine the installed fan type from the hardware fan contact signal and select a cooling fan operation table to be used by the hardware fan drivers and PMU to operate the installed cooling fan 766 according to operating performance characteristics specific to the cooling fan vendor based for the installed cooling fan. When the fan type or fan vendor is determined, the hardware fan configuration detection system causes the cooling fan to be operated according to the particular operating parameters associated with the detected cooling fan with the selection of the detected cooling fan operation table used with a fan or cooling system driver to optimize operation of the installed cooling fan rather than utilize operation parameters that are intended to accommodate any installed vendors cooling fan model. As described, if a default hardware fan contact signal is received, a default detected cooling fan operation table may be used in that case.

Figure 8:
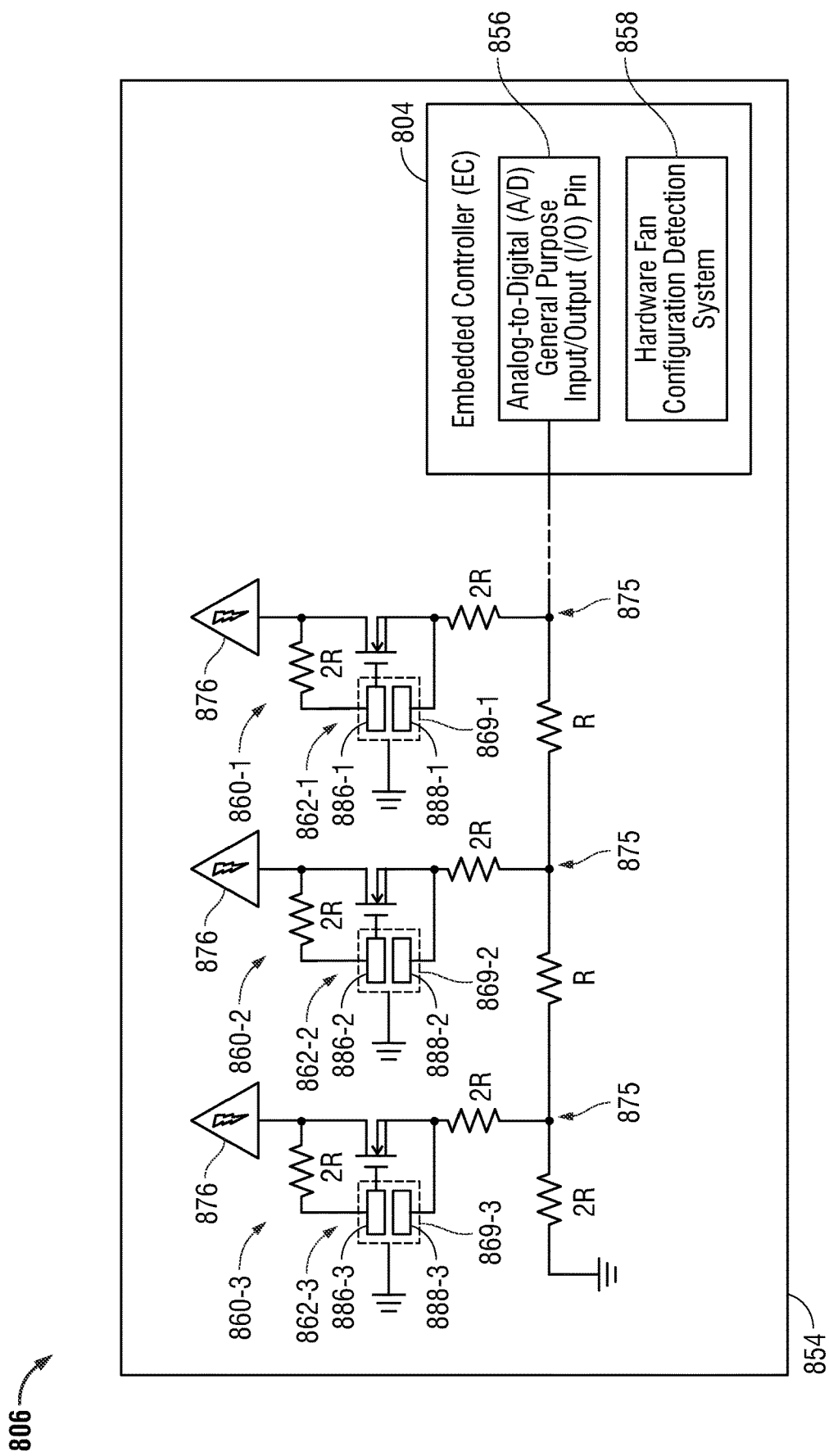
FIG. 8 is a circuit diagram of a resistor network operatively coupled to an EC operating to detect an installed cooling fan according to another embodiment of the present disclosure.

FIG. 8 is a circuit diagram of an R-2R resistor ladder network of a hardware fan detection circuit 860 with a metal oxide field effect transistor (MOSFET) circuit operatively coupled to EC 804 to detect a cooling fan contact signal from the hardware fan detection circuit 860 to identify an installed cooling fan type (not shown) according to another embodiment of the present disclosure. As described herein, the resistor network of the hardware fan detection circuit 860 shown may be one of many potential resistor networks that is operatively coupled to the EC 804 for input of the fan contact signal into the hardware fan configuration detection system executing on EC 804. It is appreciated that the R-2R resistor ladder network with MOSFET of the hardware fan detection circuit 860, along with other components of the hardware fan detection circuit 860 such as the PCB contact pads 862-1, 862-2, 862-3, the EC 804, and grounding sources, may be formed onto a PCB 854 within the information handling system. As described herein, the PCB 854 may be placed near a cooling fan installed into the information handling system. This allows one or more identification hardware gaskets of a cooling fan to be operatively coupled at any one or more locations 869-1, 869-2, 869-3 shown as dotted line boxes to come into physical contact with the PCB contact pads 862-1, 862-2, 862-3 formed onto the PCB 854 and operatively coupled to the resistor network of the hardware fan detection circuit 860 described herein.

In the embodiment shown in FIG. 8, the resistor network of the hardware fan detection circuit 860 may include an R-2R resistor ladder network modified with one or more metal-oxide-semiconductor field-effect transistors (MOSFETs) 860-1, 860-2, or 860-3 formed at each resistor network node 875 between the network node and a power source 876 as shown. The R-2R resistor ladder network may include a grounded end with one or more resistor network nodes 875 formed along the resistor network between a series of resistors and terminating an A/D GPIO pin 856 of the EC 804. Each of the nodes 875 of the resistor network may include operative connection to one or more PCB contact pads 862-1, 862-2, 862-3. In an embodiment, the number of resistor network nodes 875 is three, but any number of network nodes is contemplated. In an embodiment, the portion of the resistor network between the grounded end and a first resistor network node may have a resistor having a resistive value equal to two times those resistors placed between the first resistor network node and a second or subsequent resistor network node in the shown embodiment. Additionally, each resistor network node 875 may include a resistor between the node 875 and the MOSFET 860-1, 860-2, or 860-3 having a resistive value equal to two times those resistors placed between the first resistor network node and a second or subsequent resistor network node.

At each of each of the resistor network nodes 875, a number of PCB contact pads 862-1, 862-2, 862-3 are formed across a gate of the MOSFETS 860-1, 860-2, or 860-3. In an embodiment, each of these PCB contact pads 862-1, 862-2, 862-3 includes a first PCB contact sub-pad 886-1, 886-2, 886-3 respectively and a second PCB contact sub-pad 888-1, 888-2, 888-3 respectively. In this embodiment, the first PCB contact sub-pad 886-1, 886-2, 886-3 is operatively coupled to a drain and power source of the MOSFET 860-1, 860-2, or 860-3. The second PCB contact sub-pad 888-1, 888-2, 888-3 is operatively couples to a source of the MOSFET at the node 875 on the R-2R resistor ladder network and may be a grounded identification hardware gasket at any of the locations 869-1, 869-2, 869-3 to bridge the PCB contact sub-pads at the gate of the MOSFETS 860-1, 860-2, or 860-3. During operation, when an identification hardware gasket 869-1, 869-2, 869-3 interacts with the first PCB contact sub-pad 886-1, 886-2, 886-3 and the second PCB contact sub-pad 888-1, 888-2, 888-3 by coupling them together and thereby grounding the gate of MOSFET 860-1, 860-2, or 860-3, the MOSFET 860-1, 860-2, or 860-3 is turned off resulting in a logic low voltage on that particular resistor network node 875. In an embodiment, the identification hardware gaskets operatively coupled at any of the locations 869-1, 869-2, 869-3 include a conductive layer that electrically couples the first PCB contact sub-pad 886-1, 886-2, 886-3 respectively to the second PCB contact sub-pad 888-1, 888-2, 888-3 respectively and both to ground via the EMI shield of the cooling fan housing. The cooling fan housing may include any number of hardware gaskets including at least one conductive identification hardware gasket that may be operatively coupled at locations 869-1, 869-2, 869-3 to ground the gate of a corresponding MOSFET 860-1, 860-2, or 860-3. Where no identification hardware gaskets is coupled at a location, such as 869-1, 869-2, 869-3, to ground a particular set of first PCB contact sub-pads 886-1, 886-2, 886-3 and second PCB contact sub-pads 888-1, 888-2, 888-3 and the gate of that MOSFET 860-1, 860-2, or 860-3, the, a voltage source ($V_{cc}$) will turn on the MOSFETs 860-1, 860-2, or 860-3 and provide a logic high voltage on those particular resistor network nodes 875. The total voltage detected at the A/D GPIO pin 856 of the EC 804 is used as a fan contact signal to determine which type of cooling fan (not shown) has been installed. No identification hardware gaskets coupled at any of the locations 869-1, 869-2, 869-3 may yield a default fan contact signal in some embodiments causing selection of a default cooling fan operation table for operation of an installed fan in some embodiments. Again, where a voltage level is detected at the A/D GPIO pin 856 of the EC 804, this voltage value may be used as the fan contact signal to determine which cooling fan is installed in the information handling system. In an embodiment, the voltage detected at the A/D GPIO pin 856 of the EC 804 serves as the fan contact signal with the level of voltage being based on which of the first PCB contact sub-pads 886-1, 886-2, 886-3 and second PCB contact sub-pads 888-1, 888-2, 888-3 are electrically coupled together via the identification hardware gaskets at one or more locations 869-1, 869-2, 869-3 thereby being grounded within the R-2R resistor ladder network 860. This fan contact signal is referenced by the EC executing code instructions of the hardware fan configuration detection system to identify the installed hardware cooling fan type from a particular vendor. Then the hardware fan configuration detection system selects the corresponding detected cooling fan operation table for use with fan or cooling system drivers and the PMU for optimal operation of the hardware cooling fan installed.

Again, it is appreciated that although different fan types may be determined, these fan types may be arranged into fan vendors who produce fans used for installation into the housing of the information handling system and those fan vendors may produce fans with a particular identification hardware gasket at a location on their cooling fan to interface with a particular PCB contact pad 862-1, 862-2, or 862-3 or any combination. Additionally, it is appreciated that the number of detectable cooling fan vendors may be increased as the number of nodes or PCB contact pads 862-1, 862-2, or 862-3 increases.

Figure 9:
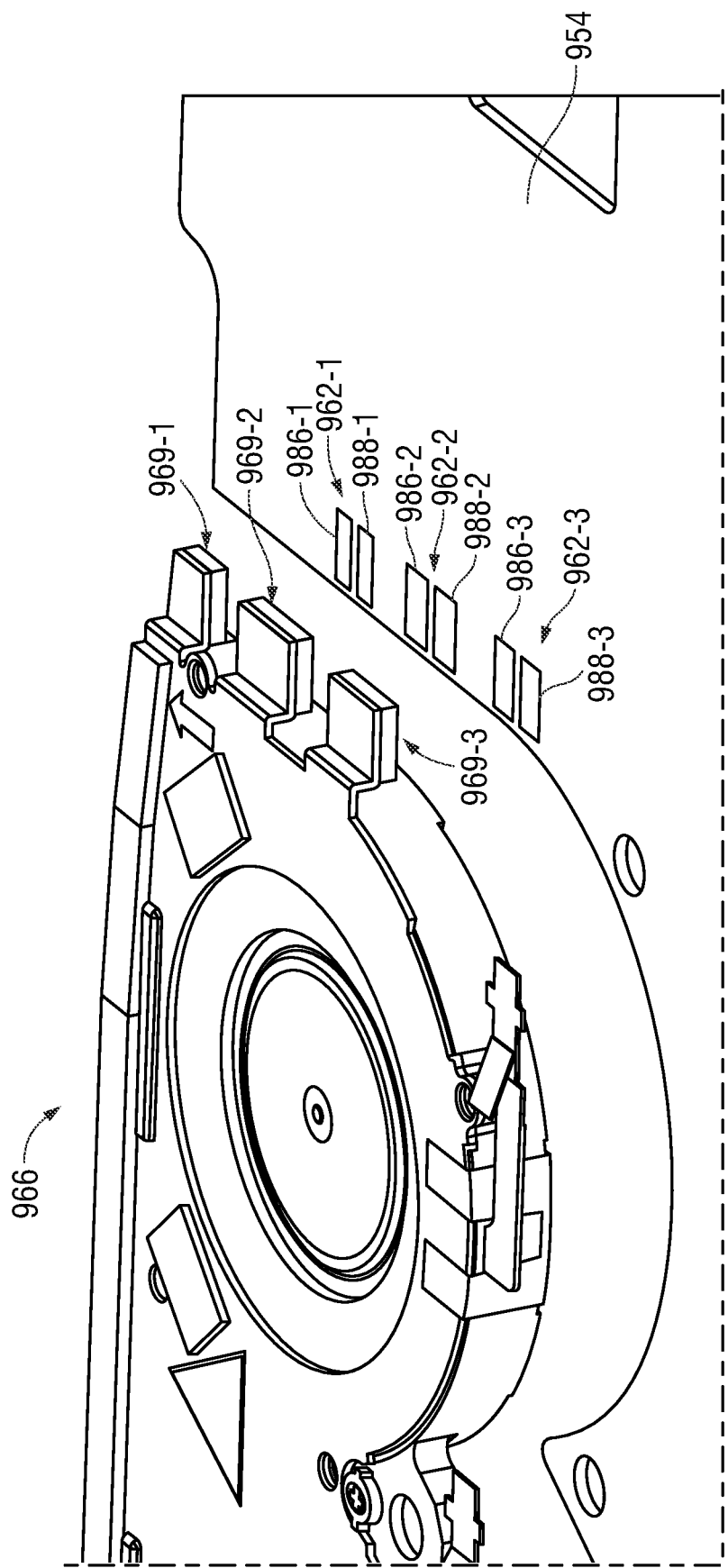
FIG. 9 is a graphic diagram of a PCB having a plurality of PCB contact pads of a resistor network and a cooling fan having a plurality of hardware gaskets according to another embodiment of the present disclosure.

FIG. 9 is a graphic diagram of a PCB 954 having a plurality of PCB contact pads 962-1, 962-2, 962-3 of a hardware fan detection circuit and a hardware cooling fan 966 with one or more hardware gaskets 969-1, 969-2, or 969-3 according to an embodiment of the present disclosure. Each of the PCB contact pads 962-1, 962-2, 962-3 may include a respective first PCB contact sub-pad 986-1, 986-2, 986-3 and second PCB contact sub-pad 988-1, 988-2, 988-3 operably coupled to a resistor network as described above in FIG. 8 and may be coupled to a cooling fan 966 via one or more identification hardware gaskets of the hardware gaskets shown as 969-1, 969-2, 969-3 according to an embodiment of the present disclosure. The identification hardware gasket may be one or more of the hardware gaskets shown as 969-1, 969-2, 969-3 with a conductive gasket interface surface and is electrically coupled to ground of the outer housing for the hardware cooling fan 966 in an embodiment. In the embodiment shown in FIG. 9, the cooling fan 966 may include an outer housing as shown that houses the rotating fan used to dissipate heat accumulated within a housing of the information handling system. The cooling fan 966 further includes one or more surfaces that extend out from the housing of the cooling fan 966, in an example embodiment, as hardware gaskets shown as 969-1, 969-2, 969-3. The outer housing of the fan 966, in an embodiment, acts as an EMI shield that allows an identification hardware gasket with a conductive gasket interface surface to be formed as any of the hardware gaskets shown as 969-1, 969-2, 969-3 that extend away from the outer housing. The identification hardware gasket may thus also be operatively coupled to ground. As shown, this extension of the housing of the cooling fan 966 may extend out from the housing and towards or above the PCB 954 on which the resistor network (not shown) and PCB contact pads 962-1, 962-2, 962-3 have been formed such that at least one identification hardware gasket may have a conductive gasket interface surface operatively couple to at least one set of first and second PCB contact sub-pads.

The embodiment shown in FIG. 9 may include the hardware fan detection circuit with resistor network and MOSFETs described in FIG. 8. The hardware fan detection circuit may include the R-2R resistor ladder network shown modified with one or more metal-oxide-semiconductor field-effect transistors (MOSFETs) formed to control voltage at each resistor network node as described above for FIG. 8. At each of each of the resistor network nodes (875 in FIG. 8), the PCB contact pads 962-1, 962-2, 962-3 have a first and second sub-pad formed to contact the gate of the MOSFETs with either the drain or source of the respective MOSFET. In an embodiment, each of these PCB contact pads 962-1, 962-2, 962-3 includes a first PCB contact sub-pad 986-1, 986-2, 986-3 and a second PCB contact sub-pad 988-1, 988-2, 988-3 as shown for example. In this embodiment, the first PCB contact sub-pad 986-1, 986-2, 986-3 is operatively coupled to a gate of the MOSFET while a second PCB contact sub-pad 988-1, 988-2, 988-3 is operatively coupled to a source of the MOSFET at the node on the R-2R resistor ladder network. During operation, when an identification hardware gaskets 969-1, 969-2, 969-3 interacts with the first PCB contact sub-pad 986-1, 986-2, 986-3 and the second PCB contact sub-pad 988-1, 988-2, 988-3 are coupled together and thereby grounding the gate of the MOSFET, the MOSFET is turned off resulting in a logic low voltage on that particular resistor network node. In an embodiment, the identification hardware gaskets from among any one of the shown hardware gaskets 969-1, 969-2, 969-3 include a conductive layer facing down to the PCB contact pads 962-1, 962-2, or 962-3. The conductive layer of the hardware gasket interface surface for the at least one identification hardware gasket electrically couples the respective first PCB contact sub-pad 986-1, 986-2, or 986-3 to the second PCB contact sub-pad 988-1, 988-2, or 988-3 at the corresponding PCB contact pad 962-1, 962-2, or 962-3 to ground the corresponding MOSFET gate via the EMI shield of the cooling fan. Where no identification hardware gasket of any of the shown position of hardware gaskets 969-1, 969-2, 969-3 electrically couples and grounds a particular first PCB contact sub-pad among 986-1, 986-2, or 986-3 to the respective second PCB contact sub-pad 988-1, 988-2, or 988-3, a voltage source ($V_{cc}$) will turn on the corresponding MOSFET via the MOSFET gate and provide a logic high voltage on that particular resistor network node. The total voltage detected at the A/D GPIO pin of the EC is used as a fan contact signal to determine which type of cooling fan 966 has been installed. Again, where a voltage level is detected at the A/D GPIO pin of the EC, this voltage value may be used during execution of code instructions of the hardware fan configuration detection system by the EC to determine which cooling fan is installed in the information handling system corresponding to the received fan contact signal. In some cases, if no identification gasket is detected, such as due to none present or a bad connection, a default fan contact signal may be received resulting in a default fan operating table being used with the installed fan in some embodiments. In an embodiment, the voltage detected at the A/D GPIO pin of the EC serves as the fan contact signal with the level of voltage being based on which of the first PCB contact sub-pad 986-1, 986-2, or 986-3 and second PCB contact sub-pad 988-1, 988-2, or 988-3 are electrically coupled together via at least one identification hardware gasket thereby ground a resistor network node within the R-2R resistor ladder network.

As the output voltage of the hardware fan contact signal is realized at the A/D GPIO pin from the hardware fan detection circuit, the EC may be capable of determining which of a plurality of different cooling fans 966 is operatively coupled within the housing of the information handling system by reference to fan contact signal levels that are stored as corresponding to a cooling fan model from particular fan vendors. Then, the EC may execute code instructions to select a detected cooling fan operation table for use with the detected cooling fan that is installed to operate the cooling fan optimally via the fan or cooling system drivers and PMU during operation of the information handling system.

Again, it is appreciated that although different fan types may be determined, these fan types may have specific arrangement or location of at least one identification hardware gasket among the plurality of possible hardware gaskets 969-1, 969-2, 969-3 shown in FIG. 9. Each fan vendor who produces fans used for installation into the housing of the information handling system may be assigned a particular location for its fans to have the identification hardware gasket. Additionally, it is appreciated that the number of detectable cooling fan vendors may be increased as the number of nodes or PCB contact pads 962-1, 962-2, 962-3 (and also the number of identification hardware gaskets used 969-1, 969-2, 969-3) increases.

Figure 10:
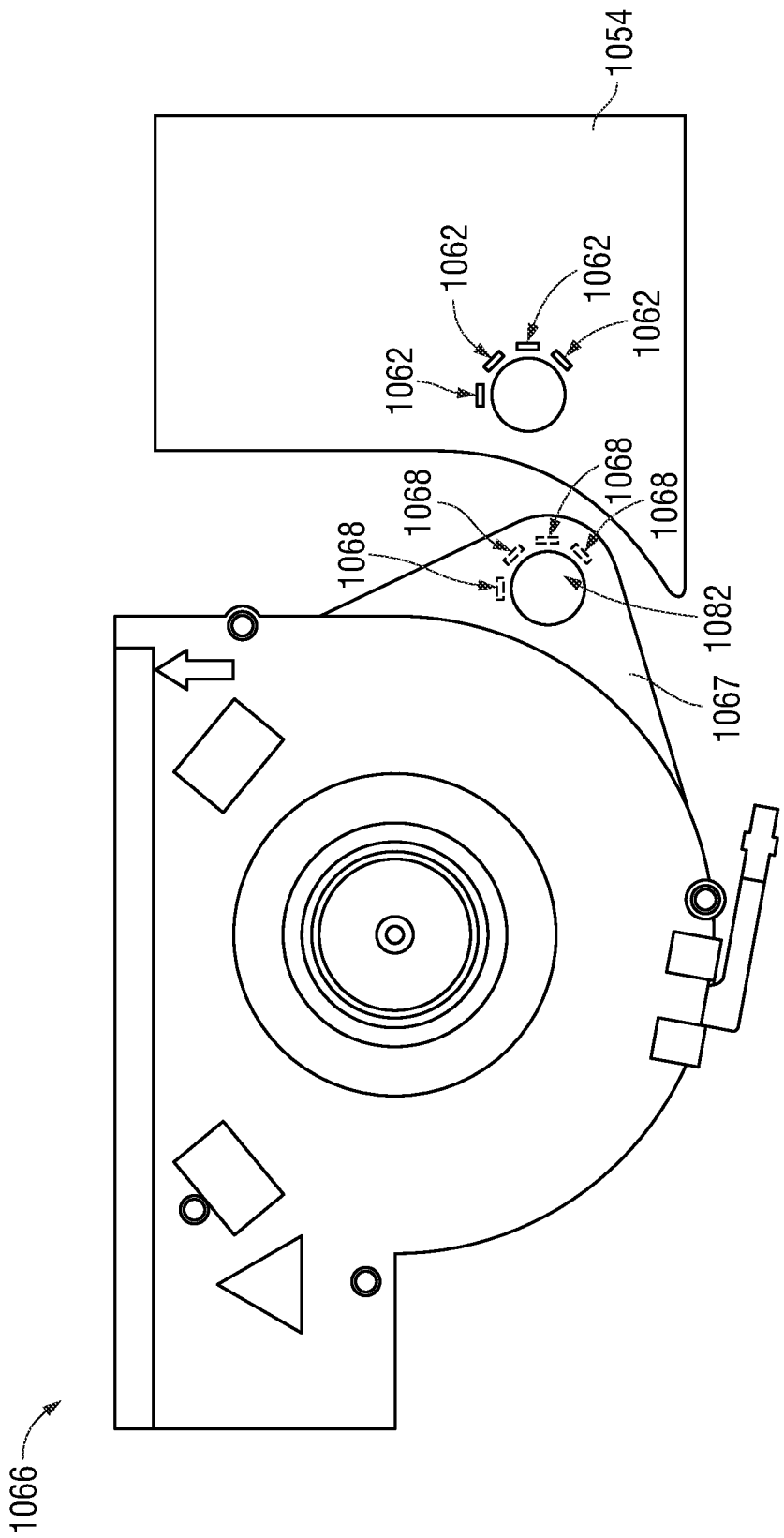
FIG. 10 is a graphic diagram of an interface between one or more PCB contact pads on a PCB and one or more hardware gaskets of a cooling fan according to an embodiment of the present disclosure.

FIG. 10 is a graphic diagram of an interface between one or more PCB contact pads 1062 on a PCB 1054 and one or more hardware gaskets 1068 of a cooling fan 1066 according to another embodiment of the present disclosure. As described herein, the interface between the one or more hardware gaskets 1068 and the PCB contact pads 1062 may be accomplished at a screw hole 1082 used to secure the cooling fan 1066 to the PCB 1054, the housing of the information handling system, or both. One or more of the hardware gaskets 1068 may include a conductive gasket interface surface to operate as an identification hardware gasket according to various embodiments herein. By orienting the PCB contact pads 1062 around a through hole formed in the PCB 1054, the hardware gaskets 1068 may be formed around a bottom surface of a screw hole 1082 formed in an extended portion 1067 of the housing of the cooling fan 1066. Because the screw hole 1082 specifically locates the cooling fan 1066 at a specific location within the housing of the information handling system, the location of one or more hardware gaskets 1068 (as indicated by dashed lines) may be specifically aligned with the corresponding PCB contact pads 1062 formed on the PCB 1054 thereby allowing for more precise alignment.

It is appreciated that the screw hole 1082 shown in FIG. 10 is one of many screw holes 1082 that may be used to secure the cooling fan 1066 into the housing of the information handling system. However, because all of the PCB contact pads 1062 may be located on the PCB 1054 where a single screw hole 1082 of the cooling fan 1066 housing is to be aligned, the other screw holes 1082 may simply be used to secure the cooling fan 1066 into the housing of the information handling system.

Figure 11:
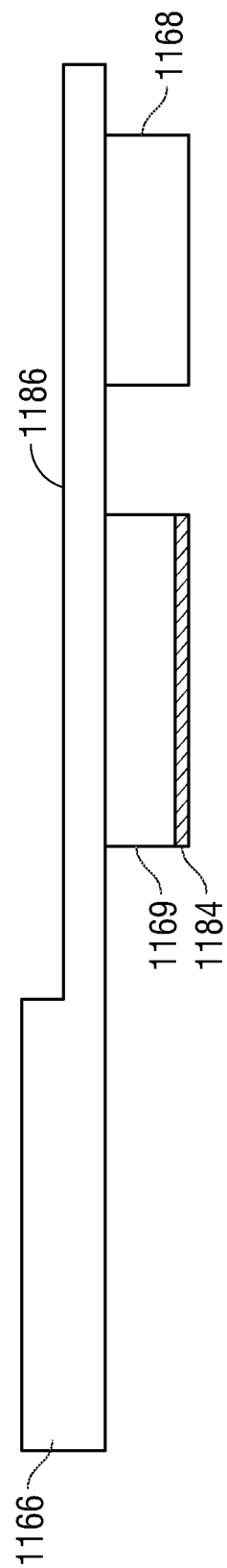
FIG. 11 is a graphic side view of an extension of a housing of a cooling fan with a hardware gasket formed thereon according to another embodiment of the present disclosure.

FIG. 11 is a graphic side view of a housing extension 1186 of a housing of a cooling fan 1166 with a hardware gasket 1168 and an identification hardware gasket 1169 formed thereon according to another embodiment of the present disclosure. As described herein, the cooling fan 1166 includes a housing extension 1186 where one or more hardware gaskets 1168 and at least one identification hardware gaskets 1169 that may be formed on a bottom side thereof in order to interface with the PCB contact pads and with the resistor network of the hardware fan detection circuits as described in various embodiments herein.

In an embodiment, the identification hardware gaskets 1169 may include a conductive layer that is a conducting gasket interface surface 1184 used to electrically couple with at least one of the PCB contact pads or among a plurality of PCB contact sub-pads as described in embodiments herein. The PCB contact pads or sub-pads being grounded or otherwise electrically connected to a respective identification hardware gasket with the conducting gasket interface surface 1184 as described herein that provides a unique hardware fan contact signal via the hardware fan detection circuit for identification of the hardware cooling fan that has been installed. It is this conductive layer of the conducting gasket interface surface 1184 that distinguishes the identification hardware gasket 1169 from the hardware gaskets 1168 that do not have a conductive layer 1184 and, therefore, do not electrically interface with the PCB contact pads and the resistor networks of the hardware fan detection circuits described in embodiments herein. This conductive layer of the conducting gasket interface surface 1184 may be a graphite layer in an embodiment. In an embodiment, the hardware gaskets 1168 or any that are formed but not used as identification hardware gaskets may be made of rubber such that they do not electrically interact with the PCB contact pads described herein. In other embodiments, only one or more identification hardware gaskets 1169 are used with any given cooling fan type. Additionally, a rubber layer may be formed on both the identification hardware gasket 1169 and the hardware gaskets 1168 such that as the cooling fan 1166 is secured into place via, for example, one or more screws, the rubber may deform a little to press the conductive layer for conducting gasket interface surface 1184 of the identification hardware gasket 1169 as well as the hardware gaskets 1168 securely against the one or more PCB contact pads and the PCB. It is appreciated also that some housing extensions 1186 may not be provided in order to reduce manufacturing costs based on the principles described herein. Additionally, in some embodiments, the conductive layer of the conducting gasket interface surface 1184 may be operatively coupled to a grounding source on the cooling fan (e.g., EMI shielding) to facilitate the interaction of the identification hardware gasket 1169 with the PCB contact pads and the resistor networks of the hardware fan detection circuits described in some embodiments herein.

Figure 12:
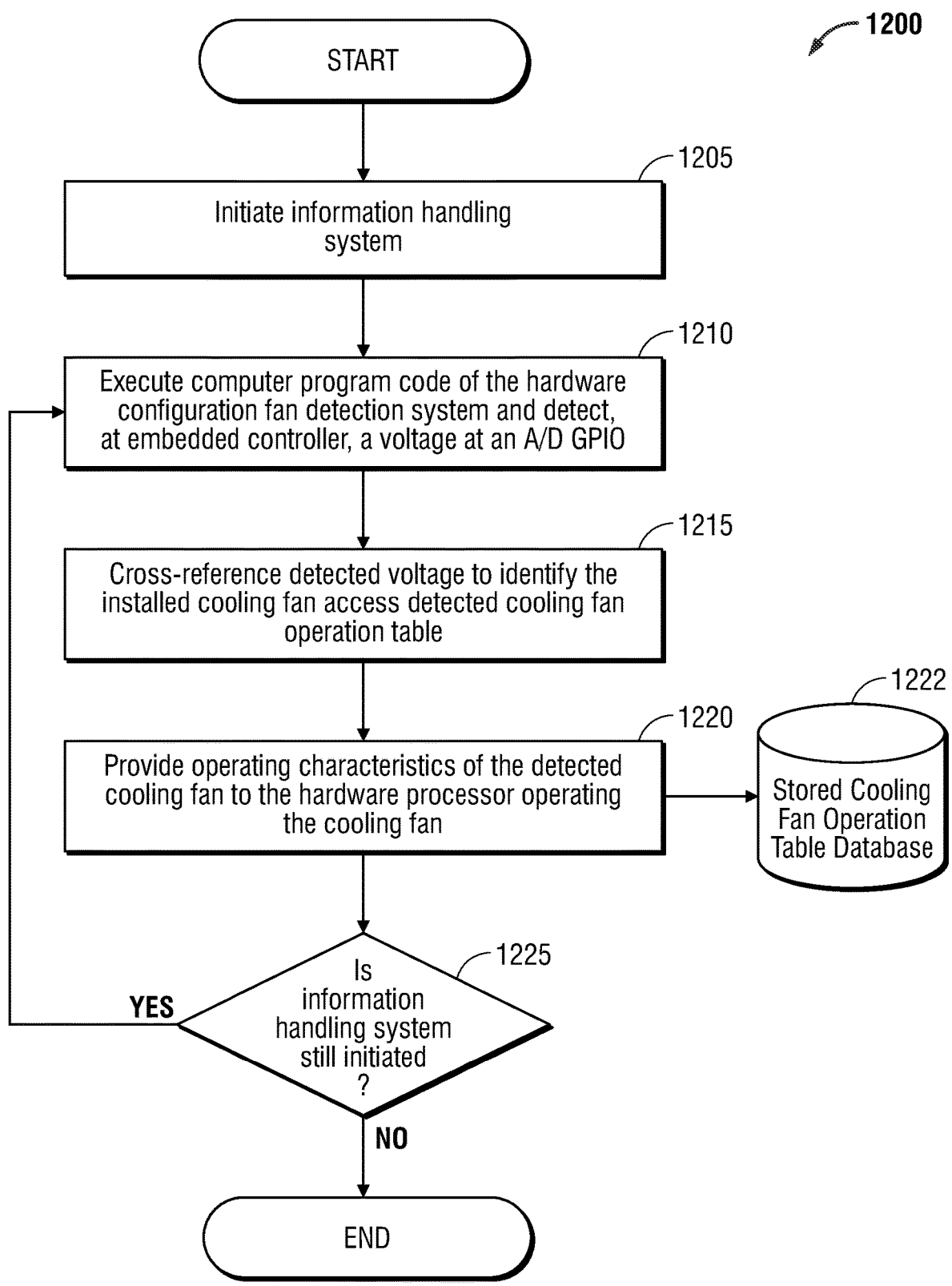
FIG. 12 is a process flow diagram of a method of identifying an installed cooling fan using a hardware fan configuration detection system with a resistor network operatively coupled to an EC according to an embodiment of the present disclosure.

FIG. 12 is a process flow diagram of a method 1200 of identifying an installed cooling fan using a hardware fan configuration detection system with a resistor network of a hardware fan detection circuit operatively coupled to an EC according to an embodiment of the present disclosure. The method 1200 may be used in connection with selecting a detected cooling fan operation table described herein for use with operation by a fan hardware driver or PMU during operation of the detected, installed hardware cooling fan.

The method 1200 may include, at block 1205, the information handling system may be initiated when, for example, a user actuates a power button. This initiation of the information handling system may include the BIOS bootstrapping computer readable program code in order to initiate an OS. Additionally, a hardware processing device at an embedded controller (EC) (or a CPU, GPU, microcontroller, etc.) may execute computer readable program code of a hardware fan configuration detection system at block 1210. The execution of the hardware fan configuration detection system by, for example, an EC results in the detection of a voltage for a hardware fan contact signal at an A/D GPIO pin of the EC. As described herein, the resistor network and PCB contact pads of a hardware fan detection circuit may be operatively coupled to the A/D GPIO pin of the EC and may provide a voltage for a fan detection signal at that pin based on the number and/or arrangement of one or more hardware gaskets that are identification hardware gaskets of a cooling fan interfacing with PCB contact pads of the resistor network.

At block 1215, the EC may execute the code instructions of the hardware fan configuration detection system to cross-reference the detected voltage with a stored list of installable hardware cooling fan models to identify the installed cooling fan and access a detected cooling fan operation table stored on a memory device within the information handling system. Again, as described herein, the detected voltage signal at the A/D GPIO pin of the EC is a fan contact signal used to determine which type of cooling fan has been installed in the information handling system. The stored list of installable hardware cooling fan models may be similar to Table 1 presented herein and may have a listing of different cooling fan types and/or cooling fan vendors. Execution of the hardware fan configuration detection system may then select among detected cooling fan operation tables for one corresponding to the detected hardware cooling fan that has been installed. The detected cooling fan operation table is selected based on correlated potential detected voltages of hardware fan contact signals assigned to each different cooling fan type and/or cooling fan vendor.

In an embodiment, the data storage device of the information handling system may further include providing operating characteristics associated with each of the cooling fan types and/or cooling fan vendors as detected to the fan drivers for operation of the installed hardware cooling fan. These operating characteristics are part of the detected cooling fan operation table selected based on the fan contact signal identifying the type of cooling fan installed and may include a difference in fan speed (e.g., rounds per minute), air displacement (e.g., cubic feet per minute air displacement), acoustic performance, and fan blade length, among other characteristics particular to the installed cooling fan. This detected cooling fan operation table may affect the fan driver software and PMU operation when the installed cooling fan and thermal control system of the information handling system are operating enabling tailored operation for a particular model of cooling fan that has been installed within the manufacture of the information handling system automatically. For example, air displacement at a certain RPM of a particular vendor-manufactured cooling fan may vary significantly from the air displacement at the same RPM of different other vendor-manufactured cooling fans. These changes may be significant enough that utilization of the operating characteristics specific to each cooling fan vendor may allow efficient utilization of any beneficial operating aspects of each vendors fans, which may have trade-offs, without having to rely on a lowest common denominator set of operating characteristics. Even where a manufacturer of an information handling system requests specific cooling fan specifications, the cooling capabilities of the cooling fans manufactured by the different cooling fan vendors may differ slightly. These differences can be determined by conducting laboratory experiments, and the manufacturer of the information handling system may store these operating characteristics on the data storage device 1222 on the information handling system for automatic access to the detected cooling fan operation table.

At block 1220, the EC may provide those operating characteristics from the detected cooling fan operation table associated with the detected cooling fan to the hardware processor used to operate the cooling fan. As such, the specific operating characteristics may be used to operate the currently installed cooling fan such that an optimal cooling of the information handling system is achieved according to the beneficial operating capabilities of the installed cooling fan type. This allows the manufacturer of the information handling system to select any cooling fan from a variety of vendors or manufacturers of the cooling fans and rely on the hardware fan configuration detection system described herein to identify the cooling fan and cause the detected cooling fan to be operated in the most optimal way.

At block 1225, a determination is made as to whether the information handling system is still initiated and operating. Where the information handling system is still initiated at block 1225, the method 1200 may proceed to continue to provide the operating characteristics of the cooling fan to the hardware processing device operating the cooling fan. Where, at block 1225, the information handling system is no longer operating, the method 1200 may end.

The blocks and steps of the flow diagrams of FIG. 12 or steps and aspects of the operation of the embodiments herein and discussed above need not be performed in any given or specified order. It is contemplated that additional blocks, steps, or functions may be added, some blocks, steps or functions may not be performed, blocks, steps, or functions may occur contemporaneously, and blocks, steps, or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. An information handling system comprising:
    a hardware processor and an embedded controller (EC);
    a memory device; and
    a power management unit (PMU) to provide power to the hardware processor, the EC, and the memory device;
    an installed cooling fan with an identification hardware gasket operatively coupled to the installed cooling fan;
    the EC executing computer readable program code of a hardware fan configuration detection system to detect a type of the installed cooling fan within the information handling system via a hardware fan detection circuit;
    the hardware fan detection circuit including:
        a resistor network operatively coupled to the EC; and
        a plurality of printed circuit board (PCB) contact pads operatively coupled along the resistor network, wherein placement of the identification hardware gasket on a first PCB contact pad of the plurality of PCB contact pads generates a fan contact signal that identifies the installed cooling fan.

2. The information handling system of claim 1, further comprising:
    the resistor network is operatively coupled to an analog-to-digital general-purpose input/output (AD GPIO) pin of the embedded controller, wherein a total voltage detected from each resistor network node in the resistor network at the AD GPIO pin of the embedded controller is the fan contact signal used to identify the installed cooling fan.

3. The information handling system of claim 1 further comprising:
    the plurality of PCB control pads each include:
        a grounded PCB contact sub-pad;
        a source voltage PCB contact sub-pad; and
        a bit identification PCB contact sub-pad.

4. The information handling system of claim 3, wherein operatively coupling the source voltage PCB contact sub-pad with the bit identification PCB contact sub-pad using the identification hardware gasket provides a voltage at the particular resistor network node along the resistor network and wherein operatively coupling the grounded PCB contact sub-pad with the bit identification PCB contact sub-pad using the identification hardware gasket grounds the particular resistor network node.

5. The information handling system of claim 1 further comprising:
    the plurality of PCB contact pads including a first PCB contact sub-pad and a second PCB contact pad, where the first PCB contact sub-pad operatively couples a gate of a metal-oxide semiconductor field-effect transistor (MOSFET) to a drain and the second PCB contact sub-pad couples the gate of the MOSFET to a source and a corresponding resistor network node; and
    the identification hardware gasket operatively couples at least one of the first PCB contact sub-pads and at least one of the second PCB contact sub-pads to ground to turn off the MOSFET corresponding to the first PCB contact pad and bring the corresponding resistor network node low to generate the fan contact signal.

6. The information handling system of claim 1 further comprising:
    a printed circuit board onto which the EC, the resistor network, and the PCB contact pads are formed such that the cooling fan may operatively couple the PCB contact hardware gasket to a combination of the PCB contact pads when installed.

7. The information handling system of claim 1 further comprising:
    a detected hardware fan operation table stored on the memory device for the hardware fan configuration detection system is accessed for the installed cooling fan by a hardware fan driver executing via the hardware processer based on the fan contact signal detected at the resistor network identifying the installed cooling fan.

8. The information handling system of claim 1 further comprising:
    the identification hardware gasket is of a plurality of hardware gaskets of the installed cooling fan that is equal to or less than the number of PCB contact pads of the hardware fan detection circuit.

9. A hardware fan configuration detection system of an information handling system, comprising:
    an embedded controller executing computer readable program code of the hardware fan configuration detection system code instructions to determine a type of installed cooling fan within the information handling system based on a fan contact signal received at the EC from a hardware fan detection circuit;
    a resistor network of the hardware fan detection circuit operatively coupled to the embedded controller; and
    a plurality of PCB contact pads operatively coupled along the resistor network, wherein placement of a hardware gasket operatively coupled to the installed cooling fan at one or more of the plurality of PCB contact pads generates the fan contact signal to identify the type of installed cooling fan.

10. The information handling system of claim 9, wherein the resistor network of the hardware fan detection circuit is operatively coupled to an analog-to-digital general-purpose input/output (AD GPIO) pin of the embedded controller and a total voltage detected from each resistor network node provides the fan contact signal at the AD GPIO pin of the EC serves to identify the installed cooling fan.

11. The information handling system of claim 9 further comprising:
the plurality of PCB contact pads includes:
a grounded PCB contact pad;
a source voltage PCB contact pad; and
a bit identification PCB contact pad.

12. The information handling system of claim 11, wherein operatively coupling the source voltage PCB contact pad with the bit PCB contact pad using the hardware gasket provides a voltage at a first resistor network node along the resistor network, and operatively coupling the grounded PCB contact pad with the bit identification PCB contact pad using the hardware gasket grounds the first resistor network node.

13. The information handling system of the claim 9 further comprising:
the resistor network includes an R-2R resistor ladder network that includes three resistor network nodes formed along the resistor network.

14. The information handling system of claim 9 further comprising:
a printed circuit board onto which the EC, the resistor network, and the PCB contact pads are formed such that the cooling fan may operatively couple the hardware gasket to the PCB contact pads when installed.

15. The information handling system of claim 9 further comprising:
the EC to select a fan hardware operation table stored on the memory device for the type of installed cooling fan identified by the fan contact signal upon the hardware fan configuration detection system identifying the installed cooling fan; and
the hardware processor executing code instructions of a hardware fan driver to use the selected hardware fan operation table with the installed cooling fan.

16. The information handling system of claim 9 further comprising:
the plurality of PCB contact pads including a first PCB contact sub-pad and a second PCB contact pad, where the first PCB contact sub-pad operatively couples a gate of a metal-oxide semiconductor field-effect transistor (MOSFET) to a drain and the second PCB contact sub-pad couples the gate of the MOSFET to a source and a corresponding resistor network node; and
the identification hardware gasket operatively couples at least one of the first PCB contact sub-pads and at least one of the second PCB contact sub-pads to ground to turn off the MOSFET corresponding to at least one PCB contact pad and bring the corresponding resistor network node low to generate the fan contact signal.

17. An information handling system comprising:
a hardware processor;
an embedded controller (EC);
a memory device;
a power management unit (PMU) to provide power to the hardware processor, the EC, and the memory device; and
an installed cooling fan including a plurality of hardware gaskets extending from a housing of the cooling fan including at least one identification hardware gasket;
the EC executing computer readable program code of a hardware fan configuration detection system to detect a type of the installed cooling fan within the information handling system based on a fan contact signal received at the EC from a hardware fan detection circuit;
a resistor network of the hardware fan detection circuit operatively coupled to the EC; and
a plurality of PCB contact pads operatively coupled along the resistor network, wherein placement of the at least one identification hardware gasket at a first PCB contact pad generates the fan contact signal in the resistor network to identify the installed cooling fan.

18. The information handling system of claim 17 further comprising:
the plurality of PCB contact pads including a first PCB contact sub-pad and a second PCB contact pad, where the first PCB contact sub-pad operatively couples a gate of a metal-oxide semiconductor field-effect transistor (MOSFET) to a drain and the second PCB contact sub-pad couples the gate of the MOSFET to a source and a corresponding resistor network node; and
the identification hardware gasket operatively couples at least one of the first PCB contact sub-pads and at least one of the second PCB contact sub-pads to ground to turn off the MOSFET corresponding to the first PCB contact pad and bring the corresponding resistor network node low to generate the fan contact signal.

19. The information handling system of claim 18, further comprising:
the first PCB contact pads includes:
a grounded PCB contact sub-pad;
a source voltage PCB contact sub-pad; and
a bit identification PCB contact sub-pad, wherein operatively coupling the source voltage PCB contact sub-pad with the bit identification PCB contact sub-pad using the hardware gasket provides a first voltage at a first resistor network node along the resistor network, and wherein operatively coupling the grounded PCB contact sub-pad with the bit identification PCB contact sub-pad using the PCB contact hardware gasket generates as second voltage the first resistor network node such that the fan contact signal is detected at an analog-to-digital general-purpose input/output (AD GPIO) pin of the EC that is used to identify the installed cooling fan.

20. The information handling system of claim 17 further comprising:
the resistor network and the PCB contact pads of the hardware fan detection circuit is formed onto a printed circuit board such that the installed cooling fan may operatively couple the identification hardware gasket to the first PCB contact pad when installed.

* * * * *